US010824575B2

(12) United States Patent
Lee et al.

(10) Patent No.: US 10,824,575 B2
(45) Date of Patent: Nov. 3, 2020

(54) BUFFER DEVICE SUPPORTING TRAINING OPERATIONS FOR A PLURALITY OF MEMORY DEVICES, AND MEMORY MODULE AND MEMORY SYSTEM EACH INCLUDING THE BUFFER DEVICE

(71) Applicant: SAMSUNG ELECTRONICS CO., LTD., Suwon-si, Gyeonggi-do (KR)

(72) Inventors: Jang-woo Lee, Seoul (KR); Jeong-don Ihm, Seongnam-si (KR); Byung-hoon Jeong, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 239 days.

(21) Appl. No.: 15/979,625

(22) Filed: May 15, 2018

(65) Prior Publication Data

US 2019/0079699 A1 Mar. 14, 2019

(30) Foreign Application Priority Data

Sep. 13, 2017 (KR) ........................ 10-2017-0117232

(51) Int. Cl.
*G06F 13/16* (2006.01)
*G06F 3/06* (2006.01)
*G11C 7/22* (2006.01)
*G11C 29/02* (2006.01)
(Continued)

(52) U.S. Cl.
CPC ........ *G06F 13/1689* (2013.01); *G06F 3/0604* (2013.01); *G06F 3/0656* (2013.01); *G06F 3/0659* (2013.01); *G06F 3/0679* (2013.01); *G06F 13/1673* (2013.01); *G11C 7/22* (2013.01); *G11C 29/023* (2013.01); *G11C 29/028* (2013.01); *G06F 13/1668* (2013.01); (Continued)

(58) Field of Classification Search
CPC .... G06F 3/0659; G06F 3/0604; G06F 3/0656; G06F 3/0679; G06F 13/1668; G06F 13/1673; G06F 13/1689; G06F 13/1694; G11C 7/22; G11C 29/023; G11C 29/028; G11C 5/04; G11C 7/1057; G11C 7/1084
USPC ........................................................ 711/103
See application file for complete search history.

(56) References Cited

U.S. PATENT DOCUMENTS 6,915,226 B2    7/2005   Liou
7,133,790 B2   11/2006   Liou
(Continued)

OTHER PUBLICATIONS

Office Action issued in corresponding Singapore Patent Application No. 10201805698Y dated Jan. 14, 2019.

*Primary Examiner* — Reginald G Bragdon
*Assistant Examiner* — Aaron D Ho
(74) *Attorney, Agent, or Firm* — F. Chau & Associates, LLC

(57) ABSTRACT

A memory system and a buffer device include a structure for performing training operations for a plurality of memory devices to ensure data reliability. A memory controller is configured to control a memory operation for a plurality of memory devices. A memory module includes the plurality of memory devices and a buffer device connected between the memory devices and the memory controller. Training operations for the memory devices to be performed by the buffer device including a training block with a signal delay circuit, and the memory controller performs the training operations by controlling the training block.

20 Claims, 30 Drawing Sheets

(51) Int. Cl.
*G11C 7/10* (2006.01)
*G11C 5/04* (2006.01)
(52) U.S. Cl.
CPC .............. *G11C 5/04* (2013.01); *G11C 7/1057* (2013.01); *G11C 7/1084* (2013.01)

(56) References Cited

U.S. PATENT DOCUMENTS

| | | | |
|---|---|---|---|
| 7,911,857 B1* | 3/2011 | Venkataraman | G06F 13/1689 |
| | | | 365/189.15 |
| 7,948,812 B2* | 5/2011 | Ware | G11C 29/023 |
| | | | 365/189.15 |
| 8,291,253 B2 | 10/2012 | Mueller et al. | |
| 8,379,457 B1* | 2/2013 | Chen | G11C 7/1051 |
| | | | 365/185.23 |
| 9,142,272 B2 | 9/2015 | Van Huben et al. | |
| 9,417,802 B1 | 8/2016 | Berke et al. | |
| 9,460,791 B1* | 10/2016 | Shallal | G11C 7/1093 |
| 9,536,579 B2* | 1/2017 | Iijima | G11C 7/222 |
| 9,653,147 B1 | 5/2017 | Wang et al. | |
| 9,666,264 B1* | 5/2017 | Jeter | G06F 13/4234 |
| 9,881,662 B2* | 1/2018 | Giovannini | G06F 5/06 |
| 2002/0031016 A1* | 3/2002 | Sato | G11C 7/22 |
| | | | 365/198 |
| 2007/0058479 A1* | 3/2007 | Matsui | G11C 7/1066 |
| | | | 365/189.18 |
| 2008/0225603 A1 | 9/2008 | Hein | |
| 2009/0154256 A1* | 6/2009 | Kim | G11C 7/1051 |
| | | | 365/189.05 |
| 2011/0307671 A1 | 12/2011 | Fox et al. | |
| 2014/0337539 A1* | 11/2014 | Lee | G06F 3/0656 |
| | | | 710/5 |
| 2016/0034408 A1 | 2/2016 | Lee et al. | |
| 2016/0314822 A1 | 10/2016 | Yeung et al. | |
| 2016/0357454 A1* | 12/2016 | Lee | G06F 13/385 |
| 2017/0092344 A1* | 3/2017 | Chae | G06F 13/4243 |

* cited by examiner

BUFFER DEVICE SUPPORTING TRAINING OPERATIONS FOR A PLURALITY OF MEMORY DEVICES, AND MEMORY MODULE AND MEMORY SYSTEM EACH INCLUDING THE BUFFER DEVICE

CROSS-REFERENCE TO RELATED APPLICATION

This application claims the benefit of Korean Patent Application No. 10-2017-0117232, filed on Sep. 13, 2017, in the Korean Intellectual Property Office, the disclosure of which is incorporated by reference herein.

1. Technical Field

The inventive concept relates to a memory system that performs training operations for a plurality of memory devices, and more particularly, to a buffer device that supports training operations for a plurality of memory devices, and a memory module and a memory system each including the buffer device.

2. Discussion of the Related Art

Due to development of memory technology, memory systems for writing and reading a large amount of data have been under development. In such a case, a plurality of memory devices are connected to a memory controller included in a memory system, so that a memory operation including write operations and read operations is controlled. However, in a structure in which a plurality of memory devices are connected to one memory controller, the memory controller has high output impedance, and thus, signals output from the memory controller do not adequately reach the plurality of memory devices.

In such memory systems, a buffer device may be connected between the memory controller and the plurality of memory devices. The buffer device can drive signals received from the memory controller and transmit the driven signals to the memory devices with a sufficient signal strength.

The memory controller performs training operations for the memory devices after a power-on is performed, to compensate for timing for at least one of a data signal (or a DQ signal) transmitted via a data DQ line and a data strobe signal (or a DQS signal) transmitted via a data strobe DQS line, to establish an optimum alignment condition and to control a memory operation.

In this way, research has been carried out to provide a memory system including a buffer device in which training operations for a plurality of memory devices can be effectively performed.

SUMMARY

An embodiment of the inventive concept provides a memory module in which training operations for a plurality of memory devices can be effectively performed using a buffer device, and a memory system including the same.

According to an embodiment of the inventive concept, there is provided a memory module comprising a plurality of memory devices; a memory controller configured to control a memory operation of the plurality of memory devices; and a buffer device connected between the memory devices and the memory controller, the buffer device comprises a training block configured to perform training operations for the plurality of memory devices; wherein the memory controller is configured to control the training block to perform the training operations.

According to an embodiment of the inventive concept, there is provided a memory controller configured to control a memory operation for a plurality of memory devices; and a memory module including the plurality of memory devices and a buffer device connected between the plurality of memory devices and the memory controller, wherein the buffer device includes a training block configured to perform training operations for the plurality of memory devices, and the training block performs the training operations using a first training data and a first data strobe signal, which are each received from a target memory device for the training operations from among the plurality of memory devices and generates a first timing compensation information for reference by the buffer device during a timing compensation operation for signals relating to a memory operation transmitted/received by the plurality of memory devices.

According to an embodiment of the inventive concept, there is provided a memory module including: a plurality of memory devices; and a plurality of buffer devices configured to route signals to and from the plurality of memory devices, wherein the plurality of buffer devices include: a first sub-buffer device connected to first memory devices from among the plurality of memory devices; a second sub-buffer device connected to second memory devices from among the plurality of memory devices; and a main buffer device connected to the first sub-buffer device and the second sub-buffer device, and the main buffer device is configured to perform first training operations for the first sub-buffer device and the second sub-buffer device, and the first sub-buffer device is configured to perform second training operations for the first memory devices, and the second sub-buffer device is configured to perform third training operations for the second memory devices. The first training operations, second training operations and third training operations comprise generation of timing compensation information for one or more of a read training operation, and a write training operation.

According to an embodiment of the inventive concept, there is provided a semiconductor package including: a buffer layer configured to communicate with a memory controller; at least one memory layer stacked on the buffer layer and including at least one memory core; and at least one through silicon via (TSV) that passes through the at least one memory layer, wherein the buffer layer includes a training block including a signal delay circuit, and the training block is configured to perform training operations for the at least one memory core of the memory layer, and a degree of delay of the signal delay circuit is controlled by the memory controller for the training operations to be performed.

According to an embodiment of the inventive concept, there is provided a semiconductor package including: a buffer layer configured to route signals between a memory controller and a memory core; at least one memory layer stacked on the buffer layer and including at least one memory core; and at least one through silicon via (TSV) that passes through the at least one memory layer, wherein the buffer layer performs training operations for the at least one memory core of the at least one memory layer and generates timing compensation information for transmission/reception signals between the buffer layer and the at least one memory layer according to the at least one memory core.

According to an embodiment of the inventive concept, a method of manufacturing a semiconductor package includes a memory system with a structure configured to perform training operations, the method comprising: forming a memory system as part of a semiconductor package that includes one or more memory chips having a memory cell array, a memory controller, and a buffer chip for routing transmission/reception signals between the one or more memory chips and the memory controller, and the buffer chip includes a training block with a decision circuit that determines a degree of timing compensation for signals transmitted and received between the buffer chip and the memory chips; and independently performing, by the buffer chip, the training operations for the one or more memory chips with the memory controller.

According to an embodiment of the inventive concept, the training operations between the buffer chip and the memory controller, and between the one or more memory chips and the buffer chip are performed simultaneously.

According to an embodiment of the inventive concept the training operations between the buffer chip and the memory controller, and between the one or more memory chips and the buffer chip are performed to overlap each other.

According to an embodiment of the inventive concept, a method of manufacturing a semiconductor package includes a memory system with a structure configured to perform training operations, the method comprising: forming a memory system as part of a semiconductor package that includes one or more memory chips having a memory cell array, a memory controller, and a buffer chip for routing transmission/reception signals between the one or more memory chips and the memory controller; and performing, by the memory controller, training operations for the buffer chip and subsequently performing, under control of the memory controller, training operations for the one or more memory chips using the buffer chip.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described with reference to the attached drawings in detail.

Figure 1:
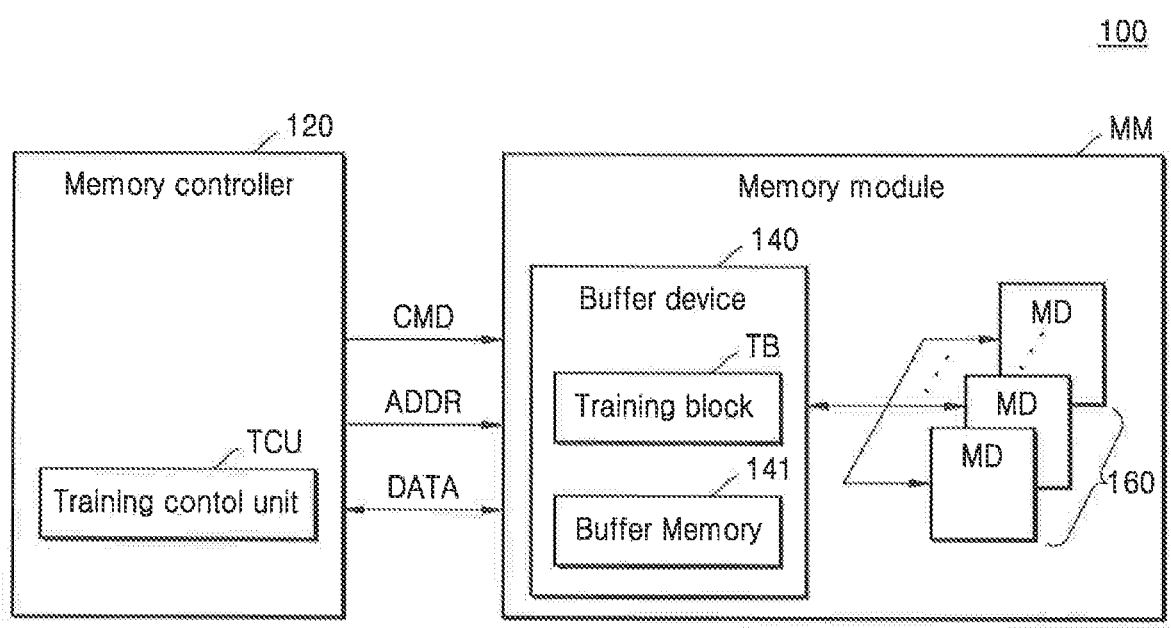
FIG. 1 is a schematic block diagram of a memory system according to an embodiment of the inventive concept.

FIG. 1 is a block diagram schematically illustrating a memory system 100 according to an embodiment of the inventive concept.

Referring now to FIG. 1, the memory system 100 may include a memory controller 120 and a memory module MM. The memory module MM may include a buffer device 140 (or a buffer chip) and a plurality of memory devices 160 (or a plurality of memory chips). The buffer device 140 may be connected between the memory controller 120 and the plurality of memory devices 160. The buffer device 140 may, inter alia, provide an impedance matching so that signals output from the memory controller 120 are provided with a sufficient strength to the plurality of memory devices.

The memory controller 120 may control a memory operation for the plurality of memory devices 160. In more detail, the memory controller 120 may transmit signals including an address signal ADDR, a command CMD, and data DATA to the memory module MM via predetermined data DQ lines. The buffer device 140 may receive the address signal ADDR, the command CMD, and the data DATA to route them to the memory devices 160. In an embodiment, the address signal ADDR may include a selection signal (for example, a chip enable signal) for the memory devices 160, and the buffer device 140 may route the address signal ADDR, the command CMD, and the data DATA to the memory devices corresponding to the selection signals. The memory devices 160 may receive signals relating to a memory operation including the address signal ADDR, the command CMD, and the data DATA from the buffer device 140 and may perform a memory operation including write operations and read operations based on the signals relating to the memory operation.

Hereinafter, a signal transmitted via a data DQ line between the memory controller 120 and the memory module MM or a data DQ line between the buffer device 140 and each of the memory devices 160 is referred to as a data signal. Also, a signal transmitted via a data strobe DQS line between the memory controller 120 and the memory module MM or a data strobe DQS line between the buffer device 140 and each of the memory devices 160 is referred to as a data strobe signal.

With continued reference to FIG. 1, the memory devices 160 may include a memory cell array (not shown), and the memory cell array may include a plurality of memory cells disposed in regions in which a plurality of wordlines and a plurality of bitlines cross one another.

In an embodiment of the inventive concept, a plurality of memory cells included in each of memory devices 160 may comprise volatile memory cells or non-volatile memory cells. For example, the plurality of memory cells may be non-volatile memory cells, such as flash memory, resistive read access memory (RAM), phase change RAM (PRAM), or magnetic RAM (MRAM), or furthermore, volatile memory cells, such as dynamic RAM (DRAM).

The memory controller 120 according to an embodiment of the inventive concept may include a training control unit (TCU), and the buffer device 140 may include a training block (TB). In an embodiment, the training control unit (TCU) includes circuitry configured for operation that may control training operations for the buffer device 140. For example, the buffer device 140 may further include buffer memory 141 for temporarily storing signals received from the memory controller 120 or buffering. Thus, the training operations for the buffer device 140 may be performed. The TCU may perform the training operations for the buffer device 140 so that the memory controller 120 may determine a degree of timing compensation for signals transmitted to the buffer device 140 and a degree of timing compensation for signals received from the buffer device 140. Detailed descriptions thereof will be provided in FIGS. 3A through 3D.

A timing-compensating operation for signals that will be subsequently described herein may be interpreted as an operation of delaying signals using a delay circuit, and the like. For example, the degree of timing compensation may be interpreted to correspond to a degree of delay, for example.

According to an embodiment of the inventive concept, the training operations for the memory devices 160 may be performed differently according to various configurations of the training block TB.

For example, in an embodiment, the training block TB may not include a decision circuit configured to determine a degree of timing compensation for signals transmitted by the buffer device 140 to the memory devices 160 and a degree of timing compensation for signals received from the memory devices 160). If the training block TB does not include a decision circuit, the TCU may perform the training operations for the memory devices 160 by controlling the training block TB. Exemplary descriptions of such operations thereof will be provided with descriptions of FIGS. 4A through 4D.

Conversely, when the training block TB includes the decision circuit, the training block TB may perform the training operations for the memory devices 160 in parallel to the training operations for the buffer device 140 of the memory controller 120. Detailed descriptions of such operations thereof will be provided in FIGS. 6A through 6D.

In FIG. 1, the TCU of the memory controller 120 and the training block TB of the buffer device 140 are elements for performing the training operations. However, embodiments of the inventive concept are not limited thereto, and of course, at least one element included in the TCU and at least one element included in the training block TB may be used when a memory operation is performed on the memory system 100. Also, each of the TCU and the training block TB may be a hardware block including an analog circuit and/or a digital circuit, or a software block including a plurality of instructions performed by the memory controller 120 or the buffer device 140.

Thus, the memory system 100 according to the present inventive concept uses the buffer device 140 when performing the training operations for the plurality of memory devices 160, so that reliability for the training operations may be enhanced.

Figure 2:
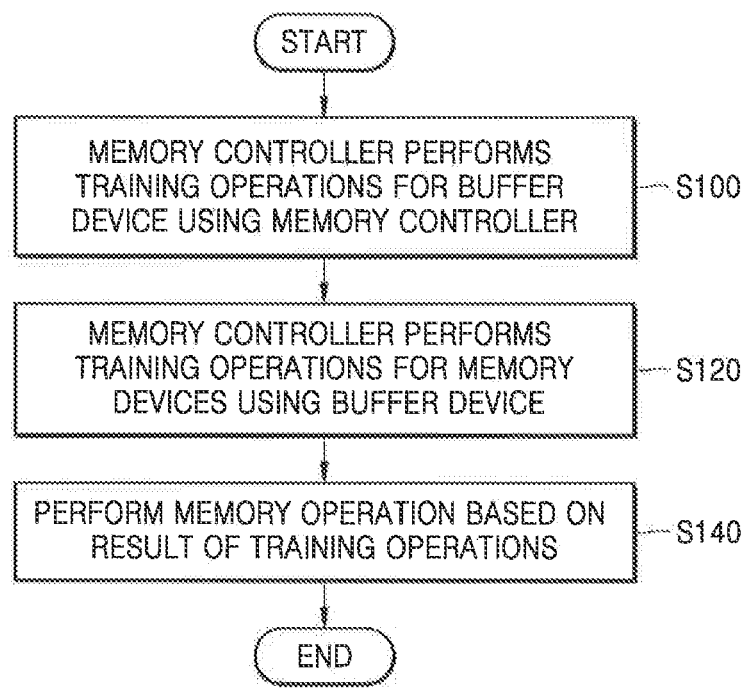
FIG. 2 is a flowchart illustrating training operations to be performed in the memory system of FIG. 1, according to an embodiment of the inventive concept.

FIG. 2 is a flowchart illustrating training operations performed on the memory system 100 of FIG. 1 according to an embodiment of the inventive concept. Hereinafter, the case when the training block TB does not include an element, such as a decision circuit, will be assumed and described. In this embodiment, training operations are performed for both the buffer device and the memory devices using the buffer device.

Referring now to FIGS. 1 and 2, at operation (S100), the memory controller 120 may perform training operations for the buffer device 140. For example, for the memory controller 120 to perform the training operations for the memory devices 160 using the training block TB of the buffer device 140, firstly, the alignment of signals between the memory controller 120 and the buffer device 140 (for example, alignment between data signals and data strobe signals) are optimized. Thus, the memory controller 120 may perform training operations for the buffer device 140 before starting the training operations for the memory devices 160 using the training block TB, and may determine a degree of timing compensation for signals transmitted by the memory controller 120 to the buffer device 140 and a degree of timing compensation for signals received from the buffer device 140. The memory controller 120 may store timing compensation information indicating the determined degree of timing compensation in a predetermined memory region (for example, a register).

At operation (S120), the memory controller 120 may perform the training operations for the memory devices 160 using the buffer device 140 after performing the training operations for the buffer device 140. In detail, the memory controller 120 performs the training operations for the memory devices 160 using the training block TB, thereby determining a degree of timing compensation for signals transmitted by the buffer device 140 to the memory devices 160 and a degree of timing compensation for signals received from the memory devices 160. The memory controller 120 may transmit the timing compensation information indicating the determined degree of timing compensation to the buffer device 140, and the buffer device 140 may store the timing compensation information in a predetermined memory region (for example, the buffer memory 141 or the register).

At operation (S140), the memory operation for the plurality of memory devices 160 may be performed based on a result of the sequentially-performed training operations. This memory operation is based on the timing compensation information that was determined based on the training operations for the buffer device and the memory devices. In detail, the skew between signals generated in a high-frequency operation is reduced through timing compensation for signals by referring to the timing compensation information generated as the result of performing the training operations during the memory operation.

Figure 3A:
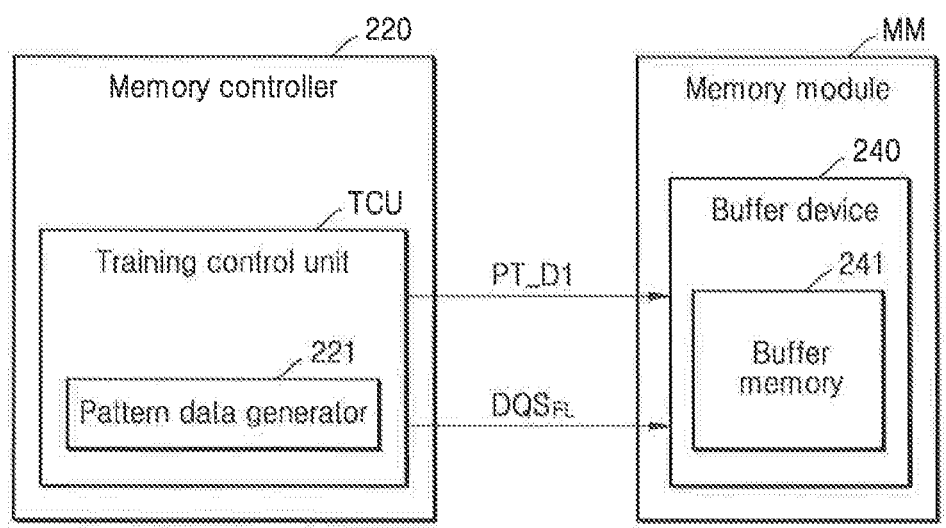
FIGS. 3A and 3B are block diagrams illustrating read training operations for a buffer device.
Figure 3B:
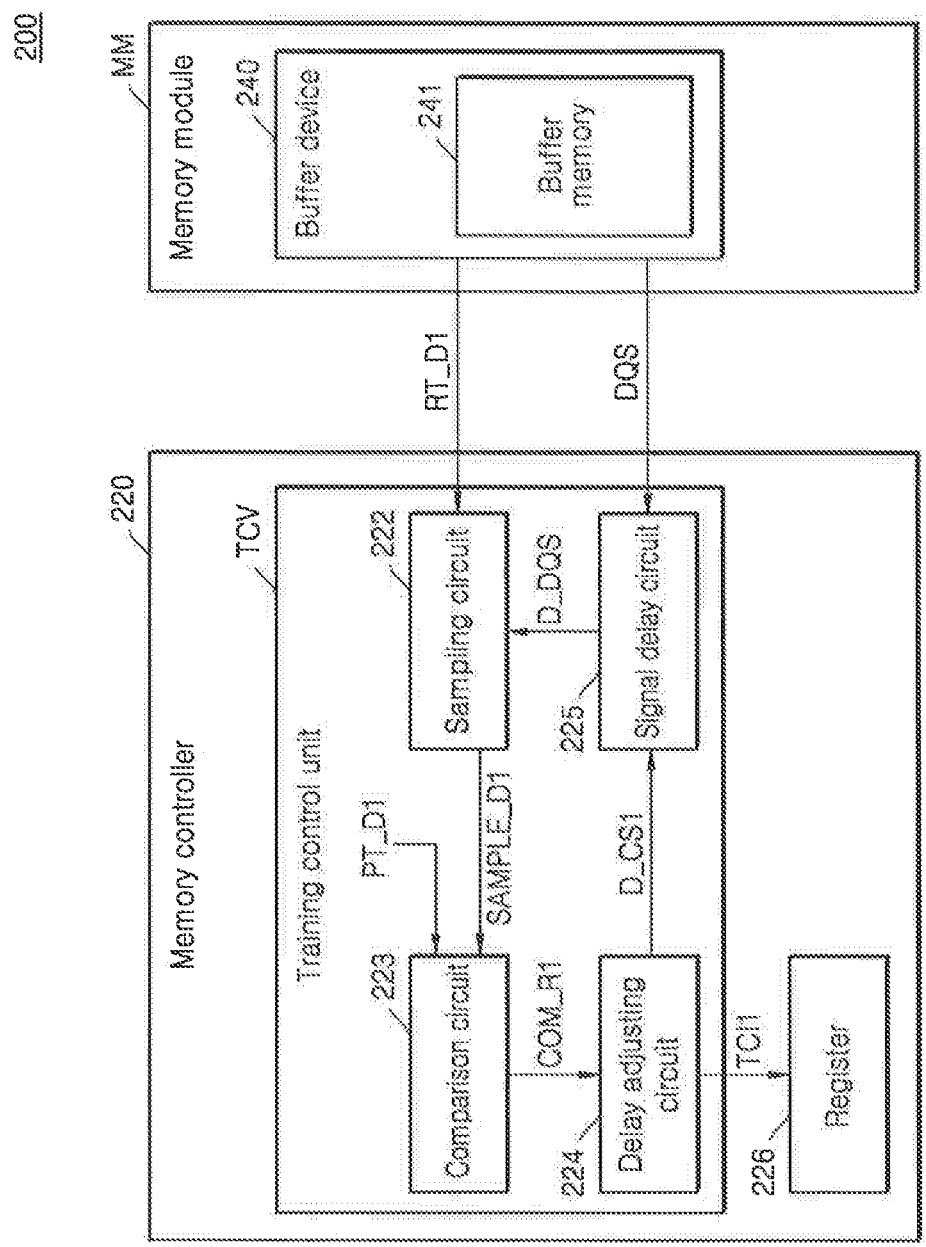
Figure 3C:
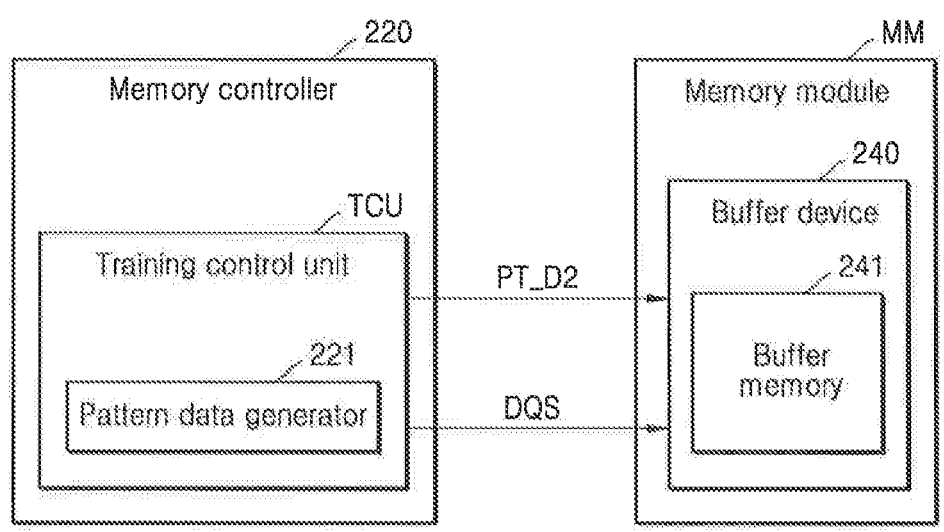
FIGS. 3C and 3D are block diagrams illustrating write training operations for the buffer device.
Figure 3D:
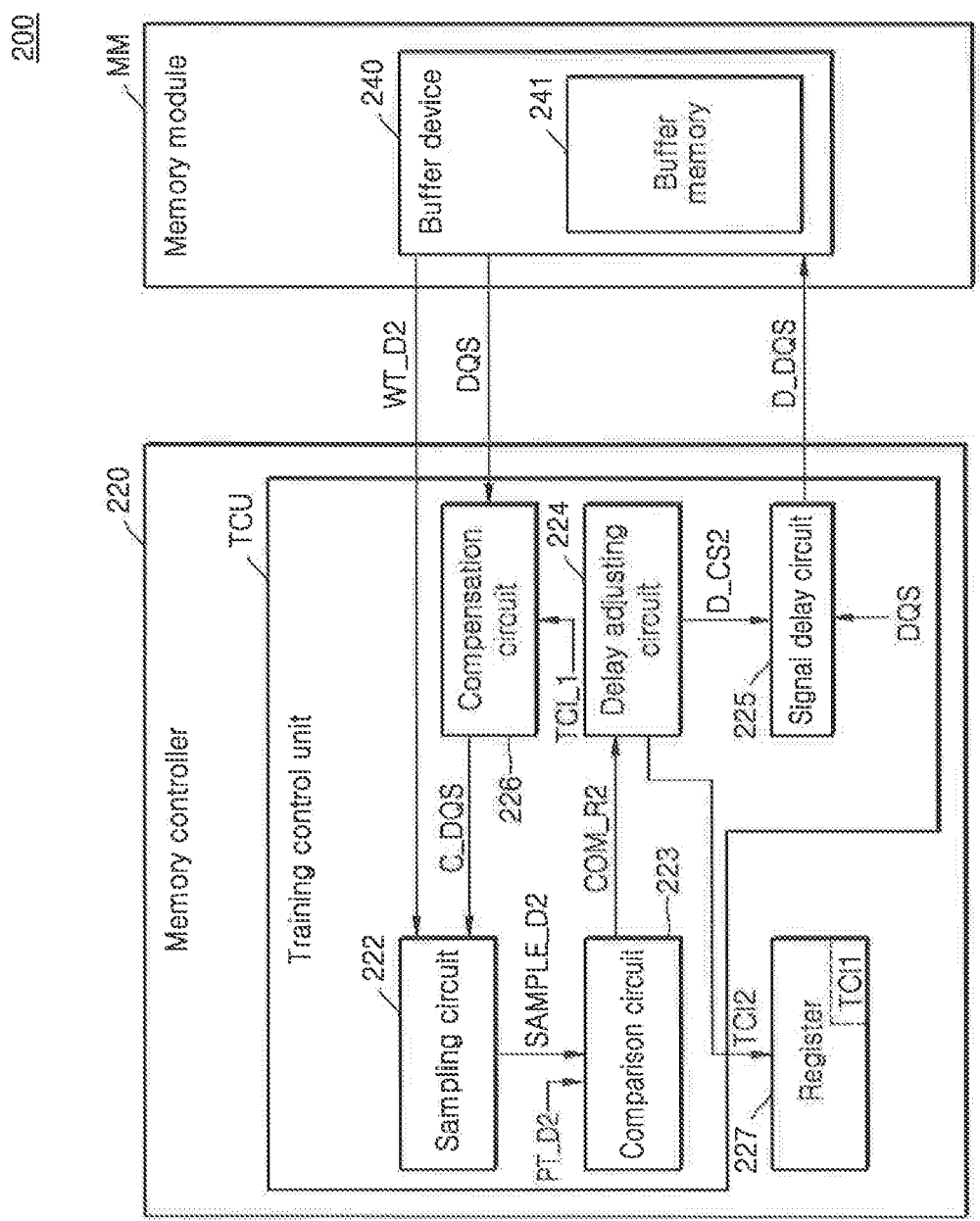

FIGS. 3A and 3B are block diagrams illustrating read training operations for a buffer device 240, and FIGS. 3C and 3D are block diagrams for explaining write training operations for the buffer device 240.

Referring to FIG. 3A, a memory system 200 according to an embodiment of the inventive concept may include a memory controller 220 and a memory module MM, and the memory module MM may include at least one buffer device 240. As described above, the memory controller 220 may include a training control unit (TCU), and the TCU may include a pattern data generator 221 for generating arbitrary pattern data (or a pattern sequence).

The TCU may transmit first pattern data PT_D1 (generated by the pattern data generator 221) via a data signal line to the buffer device 240. The TCU may transmit a data strobe signal $DQS_{FL}$ having a sufficiently low frequency at which a miss-match does not occur due to skew with the transmitted first pattern data PT_D1, to the buffer device 240. The buffer device 240 may sample the first pattern data PT_D1 using the data strobe signal $DQS_{FL}$ to write the first pattern data PT_D1 into buffer memory 241.

Referring now to FIG. 3B, the TCU may include a sampling circuit 222, a comparison circuit 223, a delay adjusting circuit 224, and a signal delay circuit 225. The buffer device 240 may transmit a signal generated in response to sampling the first pattern data PT_D1, as previously described in FIG. 3A. For example, as shown in FIG. 3B, the buffer device 240 may transmit a first read training data RT_D1 to the sampling circuit 222 and may transmit a data strobe signal DQS having a high frequency to the signal delay circuit 225. In an example, the data strobe signal DQS may have the same frequency as that of a data strobe signal used in a read operation.

The sampling circuit 222 may receive a delayed data strobe signal D_DQS from the signal delay circuit 225, may sample the first read training data RT_D1 using the delayed data strobe signal D_DQS to generate a first sampling data SAMPLE_D1. The comparison circuit 223 may compare the first pattern data PT_D1 with the first sampling data SAMPLE_D1, thereby generating a first comparison result COM_R1. The delay adjusting circuit 224 may generate a first delay control signal D_CS1 used to control a degree of delay of the signal delay circuit 225 based on the first comparison result COM_R1. The signal delay circuit 225 may change the degree of delay based on the first delay control signal D_CS1 to delay the data strobe signal DQS.

The TCU may perform the operations by the correspondingly-named components in FIGS. 3A and 3B as part of a read training operation for the buffer device 240 a plurality of times repeatedly. The delay adjusting circuit 224 may generate a first timing compensation information (TCI1) based on the first comparison result COM_R1. The first timing compensation information TCI1 that is generated by performing the read training operation for the buffer device 240, may be information indicating a degree of optimum timing compensation for at least one of a data signal and a data strobe signal, which are received by the memory controller 220 from the buffer device 240. In an example, when receiving the data signal and the data strobe signal from the buffer device 240, the memory controller 220 may perform a read operation after compensating for timing for the data strobe signal based on the first timing compensation information TCI1 that may be stored in register 227.

Referring now to FIG. 3C, the TCU may transmit a second pattern data PT_D2 to the buffer device 240 via a data signal line. The TCU may provide the data strobe signal DQS having a high frequency to the buffer device 240 via a data strobe signal line. In an example, the data strobe signal DQS may have the same frequency as that of a data strobe signal used in a write operation. The buffer device 240 may sample the second pattern data PT_D2 using the data strobe signal DQS. The buffer device 240 may then write the second pattern data PT_D2 into the buffer memory 241.

Referring now to FIG. 3D, the TCU may further include a compensation circuit 226, compared to FIG. 3B. The buffer device 240 may transmit a signal generated by sampling the second pattern data PT_D2, as second write training data WT_D2 to the sampling circuit 222, as illustrated in FIG. 3C. Also, the buffer device 240 may transmit the data strobe signal DQS to the compensation circuit 226. In an example, the data strobe signal DQS may have the same frequency as that of a data strobe signal used in a read operation.

The compensation circuit 226 may compensate for timing of the data strobe signal DQS by referring to the first timing compensation information TCI1, to generate compensated data strobe signal C_DQS. The sampling circuit 222 may sample the second write training data WT_D2 using the compensated data strobe signal C_DQS to generate second sampling data SAMPLE_D2. The comparison circuit 223 may compare the second pattern data PT_D2 with the second sampling data SAMPLE_D2, thereby generating a second comparison result COM_R2. The delay adjusting circuit 224 may generate a second delay control signal D_CS2 used to control a degree of delay of the signal delay circuit 225 based on the second comparison result COM_R2. The signal delay circuit 225 may change a degree of delay based on the second delay control signal D_CS2, may delay the data strobe signal DQS, and may transmit the delayed data strobe signal D_DQS to the buffer device 240 via a data strobe signal line.

The TCU may perform an operation loop described in FIGS. 3C and 3D as part of a write training operation for the buffer device 240 a plurality of times. The delay adjusting circuit 224 may generate a second timing compensation information TCI2 based on the second comparison result COM_R2. The second timing compensation information TCI2 that is generated as a result of performing a write training operation for the buffer device 240 may be stored in register 227, and may be information indicating a degree of optimum timing compensation for at least one of the data signal and the data strobe signal, which are transmitted to the buffer device 240. In an example, the memory controller 220 may compensate for timing for the data strobe signal by referring to the second timing compensation information TCI2 before transmitting the data signal and the data strobe signal for a write operation to the buffer device 240, and then may transmit the data signal and the compensated data strobe signal, thereby performing the write operation.

Figure 4A:
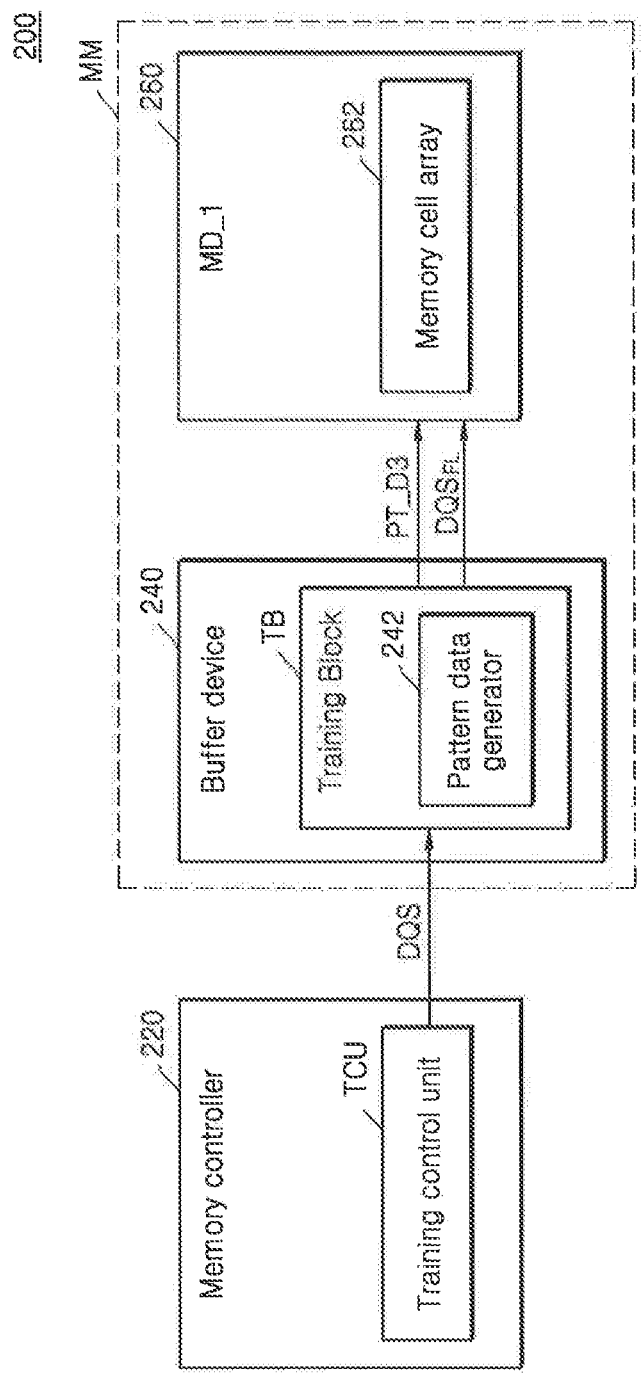
FIGS. 4A and 4B are block diagrams illustrating read training operations for a plurality of memory devices using a training block of the buffer device.
Figure 4B:
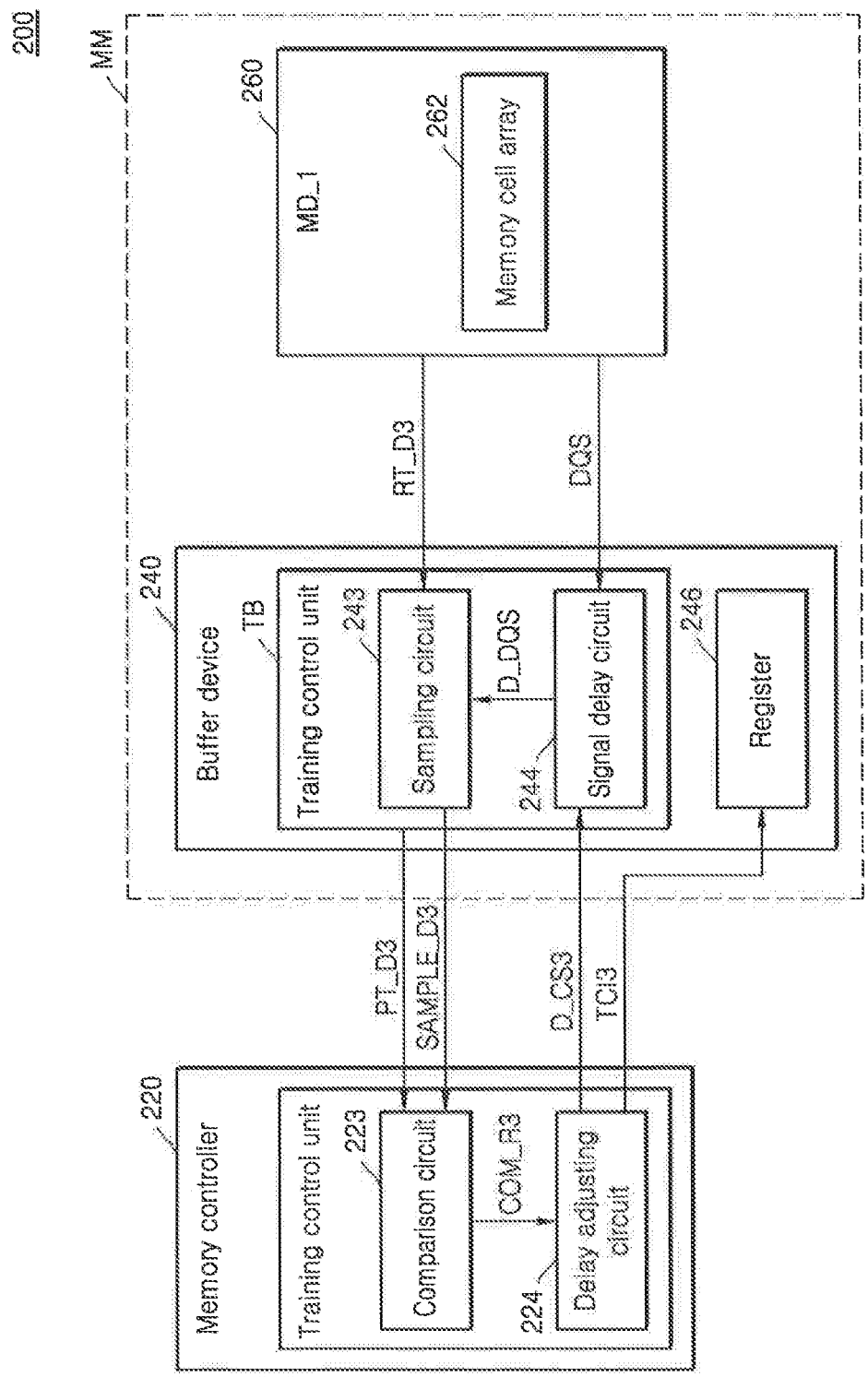
Figure 4C:
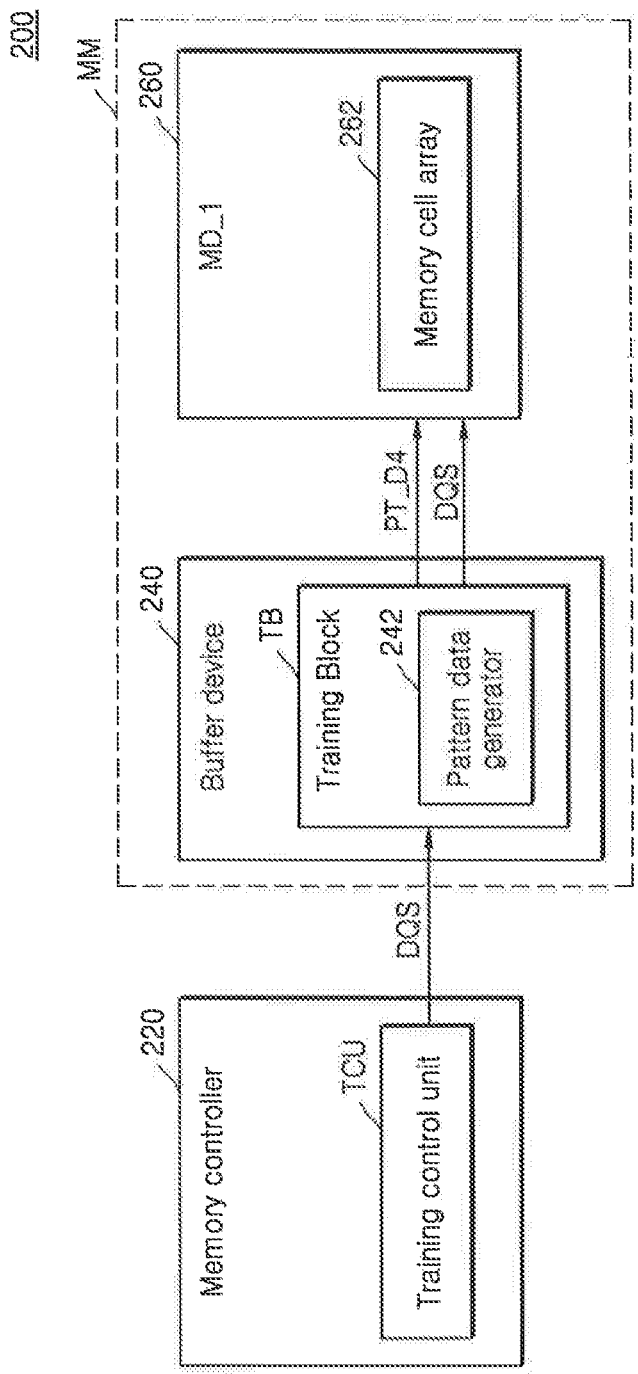
FIGS. 4C and 4D are block diagrams illustrating write training operations for the plurality of memory devices using the training block of the buffer device.
Figure 4D:
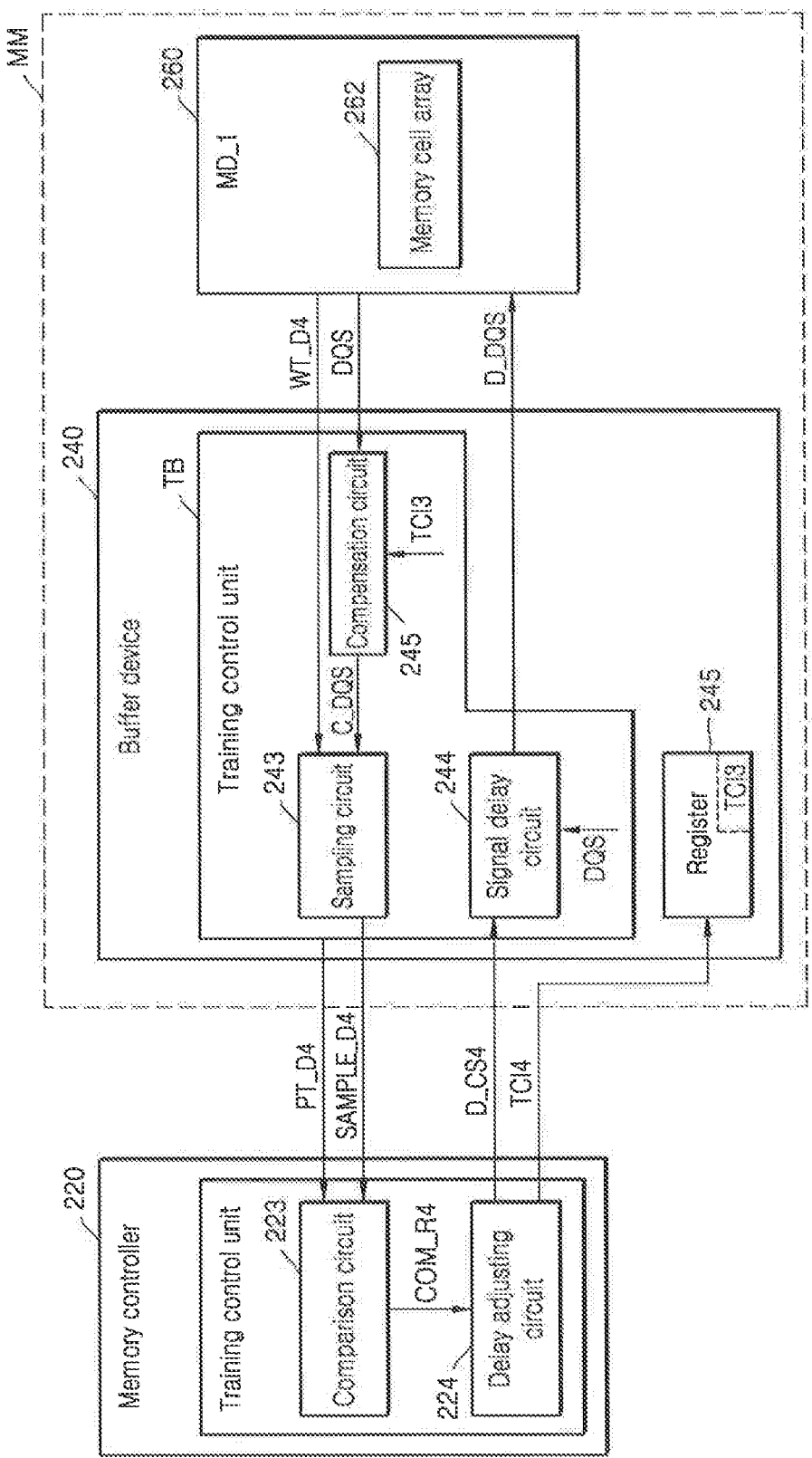

FIGS. 4A and 4B are block diagrams for explaining a read training operation for the memory device 260 using the training block TB of the buffer device 240, and FIGS. 4C and 4D are block diagrams for explaining a write training operation for the memory device 260 using the training block TB of the buffer device 240.

As shown in FIG. 2 and the like, it is assumed that a training operation for the memory device 260 is performed after the training operation for the buffer device 240 has been completed.

Referring now to FIG. 4A, the memory system 200 may include a memory controller 220 and a memory module MM, and the memory module MM may include at least one buffer device 240 and at least one memory device 260. Hereinafter, training operations for memory devices 260 selected as training objects, from among a plurality of memory devices, will be described, and training methods that will be described later may also be used in other memory devices. The memory devices may be selected as training objects by the memory controller 220 or the buffer device 240. For example, the memory controller 220 may transmit selection signals for memory devices to the memory module MM to select memory devices as training objects. In another example, when receiving signals (for example, training commands) relating to training operations, the buffer device 240 may select one or more memory devices as training objects from among the plurality of memory devices sequentially in a predetermined order.

The buffer device 240 may include the training block TB. The training block TB may include a pattern data generator 242 for generating arbitrary pattern data (or a pattern sequence). However, a person of ordinary skill in the art should appreciate that other embodiments of the inventive concept are not limited to the generation of arbitrary pattern data. For example, predetermined pattern data generated by the pattern data generator 242 included in the TCU of the memory controller 220 may be received and used.

The training block TB may transmit third pattern data PT_D3 generated by the pattern data generator 242 to the memory device 260 via a data signal line. The training block TB may transmit a data strobe signal $DQS_{FL}$ to the memory device 260 via a data strobe signal line. The data strobe signal $DQS_{FL}$ has a sufficiently low frequency at which a miss-match does not occur due to skew with the transmitted third pattern data PT_D3. In an embodiment of the inventive concept, the training block TB may divide a data strobe signal DQS' received from the memory controller 220, thereby generating a data strobe signal $DQS_{FL}$ having a low frequency. However, the aforementioned is an embodiment of the inventive concept, and the scope of the inventive concept is not limited thereto. The buffer device 240 may include an additional clock generator, or may receive a clock signal from an external clock source. The memory device 260 may sample third pattern data PT_D3 using the data strobe signal $DQS_{FL}$) to write the third pattern data PT_D3 into a memory cell array 262.

Referring to FIG. 4B, the training block TB may further include a sampling circuit 243 and a signal delay circuit 244. The memory device 260 may transmit a signal generated by sampling the third pattern data PT_D3 as third read training data RT_D3 to the sampling circuit 243 and may transmit a data strobe signal DQS having a high frequency to the signal delay circuit 244, as described in FIG. 4A. In an example, the data strobe signal DQS of FIG. 4B may have the same frequency as that of a data strobe signal used in a read operation.

The sampling circuit 243 may receive a delayed data strobe signal D_DQS from the signal delay circuit 244 and may generate third sampling data SAMPLE_D3 using the delayed data strobe signal D_DQS. Subsequently, the training block TB may transmit the third sampling data SAMPLE_D3 and the third pattern data PT_D3 to the TCU of the memory controller 220. Due to the training operations between the memory controller 220 and the buffer device 240 being complete, the TCU may receive the third sampling data SAMPLE_D3 and the third pattern data PT_D3 precisely, and hereinafter, only a core operation of the TCU will be described.

The TCU may include a comparison circuit 223 and a delay adjusting circuit 224. The comparison circuit 223 may compare the third pattern data PT_D3 with the third sampling data SAMPLE_D3, thereby generating a third comparison result COM_R3. The delay adjusting circuit 224 may generate a third delay control signal D_CS3 used to control a degree of delay of the signal delay circuit 244 of the training block TB based on the third comparison result COM_R3. The TCU may transmit the third delay control signal D_CS3 to the training block TB. As described above, due to the training operations between the memory controller 220 and the buffer device 240 being complete, the training block TB may receive the third delay control signal D_CS3 precisely. The signal delay circuit 244 may change a degree of delay based on the third delay control signal D_CS3, thereby delaying the data strobe signal DQS.

The training block TB and the TCU may perform the operations described in FIGS. 4A and 4B as part of read training operations for the memory device 260 repeatedly for a plurality of times. The delay adjusting circuit 224 may generate a third timing compensation information TCI3 based on the third comparison result COM_R3. The third timing compensation information TCI3 that is generated as a result of performing read training operations for the memory device 260, may be information indicating a degree of optimum timing compensation for at least one of a data signal and a data strobe signal, which are received by the buffer device 240 from the memory device 260, and may be stored in register 246. In an example, when receiving the data signal and the data strobe signal from the memory device 260, the buffer device 240 may compensate for the timing of the data strobe signal by referring to the third timing compensation information TCI3 and then may perform a read operation.

Referring to FIG. 4C, the training block TB may transmit a fourth pattern data PT_D4 to the memory device 260 via a data signal line. The training block TB may provide a data strobe signal DQS having a high frequency to the memory device 260 via a data strobe signal line. In an example, the data strobe signal DQS may have the same frequency as that of a data strobe signal used in a write operation. In addition, the training block TB may generate a data strobe signal DQS using a data strobe signal DQS' received from the memory controller 220. A person of ordinary skill in the art should understand and appreciate that embodiments of the inventive concept are not limited to the aforementioned example. The buffer device 240 may include an additional clock generator, or may receive a clock signal from an external clock source.

Referring now to FIG. 4D, the training block TB may further include a compensation circuit 245, which is not shown in the training block TB of FIG. 4B. The memory device 260 may provide a signal generated by sampling the fourth pattern data PT_D4 as fourth write training data WT_D4 to the sampling circuit 243, as described in FIG. 4C, and may transmit a data strobe signal DQS having a high frequency to the compensation circuit 245. In an example, the data strobe signal DQS may have the same frequency as that of a data strobe signal used in a read operation.

The compensation circuit 245 may compensate for the timing of the data strobe signal DQS by referring to the third timing compensation information TCI3, thereby generating a compensated data strobe signal C_DQS. The sampling circuit 243 may sample the fourth write training data WT_D4 using the compensated data strobe signal C_DQS to generate a fourth sampling data SAMPLE_D4. Subsequently, the training block TB may transmit the fourth sampling data SAMPLE_D4 and the fourth pattern data PT_D4 to the TCU.

The comparison circuit 223 of the TCU may compare the fourth pattern data PT_D4 with the fourth sampling data SAMPLE_D4 to generate a fourth comparison result COM_R4. The delay adjusting circuit 224 may generate a fourth delay control signal D_CS4 used to control a degree of delay of the signal delay circuit 244 of the training block TB based on the fourth comparison result COM_R4. The TCU may transmit the fourth delay control signal D_CS4 to the training block TB. The signal delay circuit 244 may change a degree of delay based on the fourth delay control signal D_CS4, may delay a data strobe signal DQS, and may provide a delayed data strobe signal D_DQS to the memory device 260 via a data strobe signal line.

The training block TB and the TCU may perform the operations of the configurations shown in FIGS. 4C and 4D as part of write training operations for the memory device 260 repeatedly a plurality of times. The delay adjusting circuit 224 may generate a fourth timing compensation information TCI4 based on the fourth comparison result COM_R4. The fourth timing compensation information TCI4 that is generated as a result of performing read training operations for the memory device 260, may be, for example, information indicating a degree of optimum timing compensation for at least one of a data signal and a data strobe signal, which are transmitted by the buffer device 240 to the memory device 260. In an example, the buffer device 240 may compensate for timing for the data strobe signal transmitted to the memory device 260 by referring to the fourth timing compensation information TCI4 and then may transmit the compensated data strobe signal and the data signal to the memory device 260, thereby performing a write operation.

Therefore, the buffer device 240 according to an embodiment of the inventive concept includes a minimum training block TB that may support training operations for the memory device 260, so the memory controller 220 may perform efficient training operations for the memory device 260 using the buffer device 240. Furthermore, the size of the buffer device 240 may be minimized.

Figure 5:
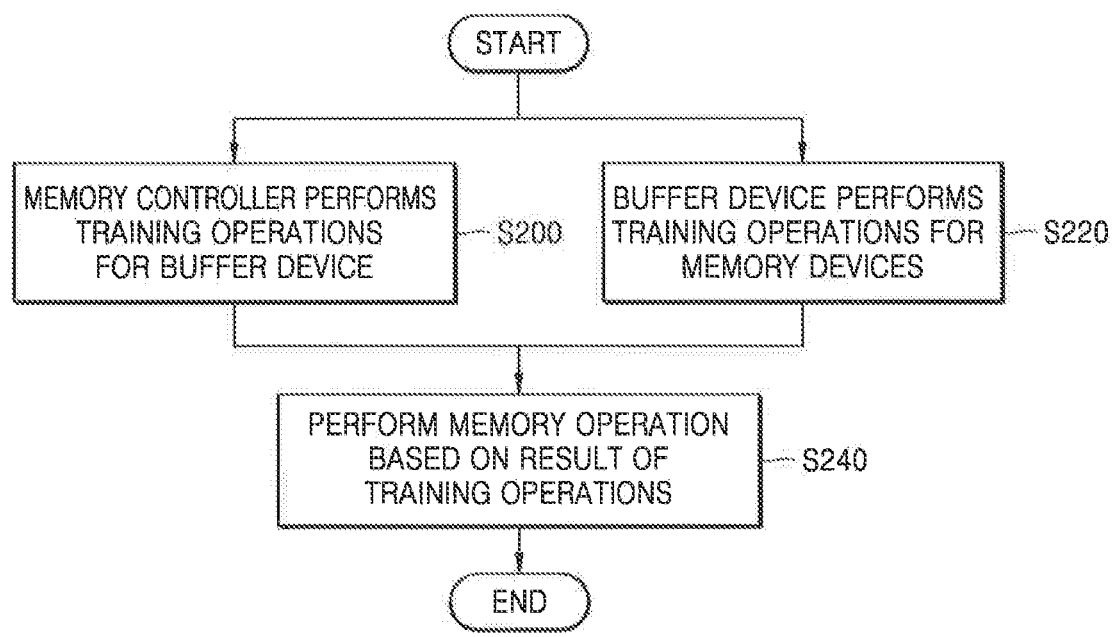
FIG. 5 is a flowchart illustrating training operations to be performed in the memory system of FIG. 1, according to an embodiment of the inventive concept.

FIG. 5 is a flowchart illustrating training operations to be performed on the memory system 100 of FIG. 1, according to an embodiment of the inventive concept. Hereinafter, the case when the training block TB includes an element, such as a decision circuit, will be assumed and described.

Referring now to FIGS. 1 and 5, at operation (S200), the memory controller 120 may perform training operations for the buffer device 140. Simultaneously being performed with the training operations for the buffer device 140, at operation (S220), the buffer device 140 may perform training operations for the memory devices 160. The reason there may be a simultaneous performance of training operations is that unlike the configuration shown in FIG. 2, the buffer device 140 may determine a degree of timing compensation for signals to be transmitted to the memory devices 160 and a degree of timing compensation for signals to be received from the memory devices 160 (e.g., both to and from the memory devices). Thus, the training operations for the memory devices 160 of the buffer device 140 may be performed in parallel to the training operations for the buffer device 140 of the memory controller 120.

Subsequently, at operation (S240), a memory operation for the memory devices 160 may be performed based on the result of the training operations performed in parallel.

Figure 6A:
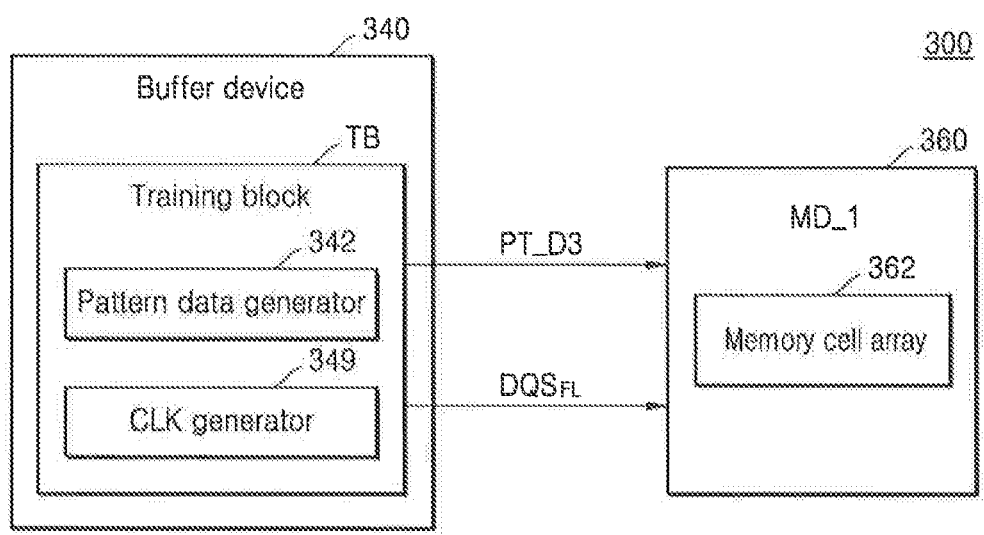
FIGS. 6A through 6C are block diagrams illustrating read training operations for the memory devices of the buffer device.
Figure 6B:
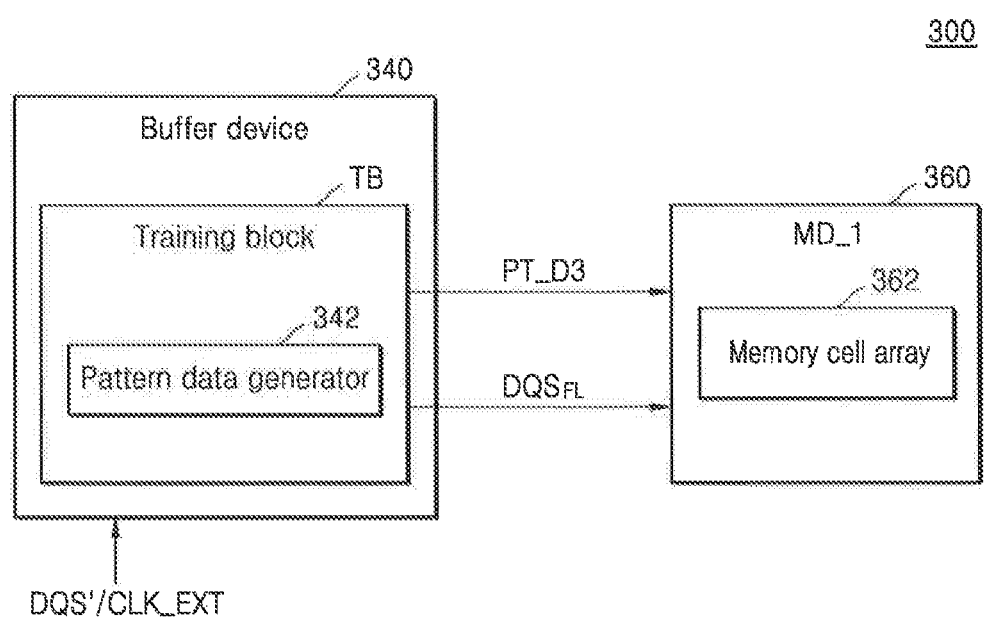
Figure 6C:
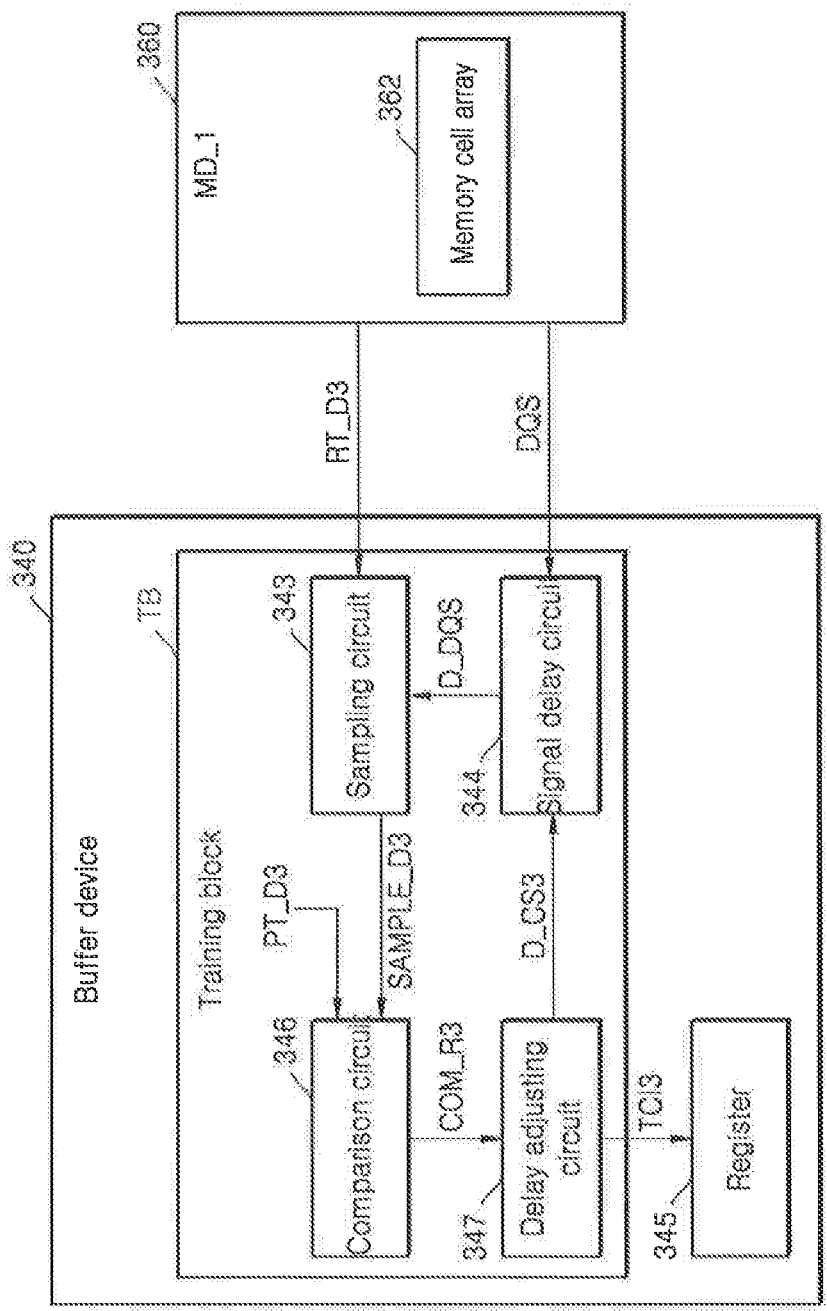
Figure 6D:
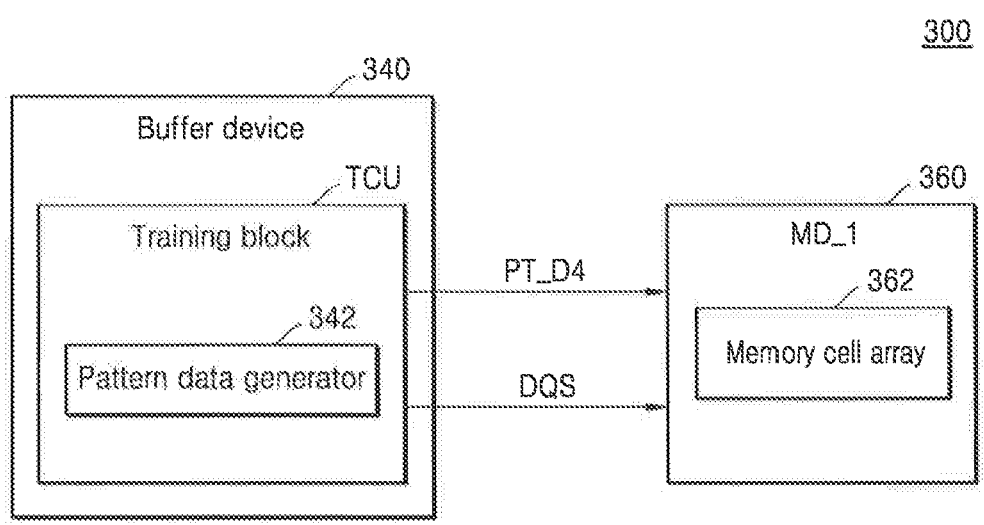
FIGS. 6D and 6E are block diagrams for explaining write training operations for the memory devices of the buffer device.
Figure 6E:
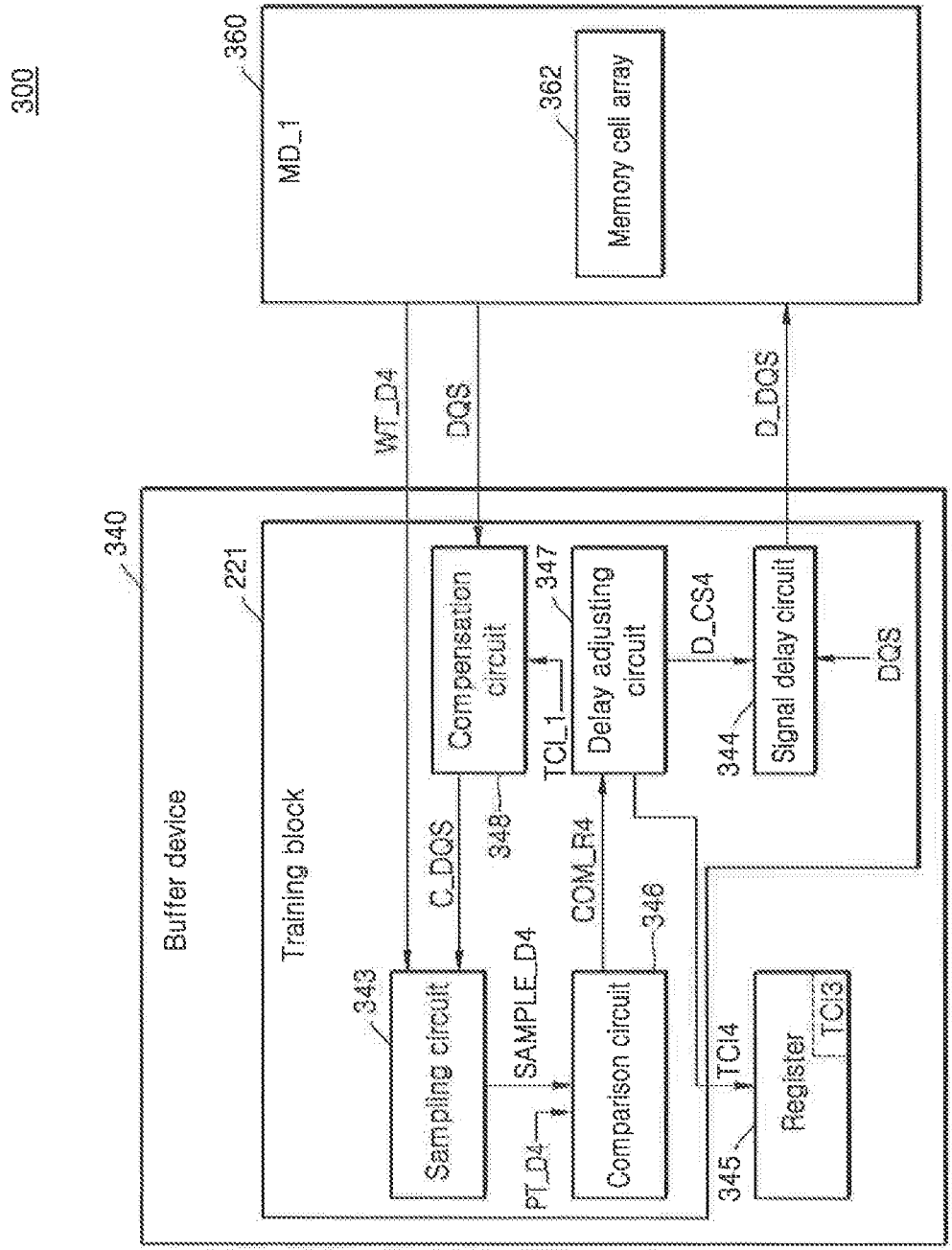

FIGS. 6A through 6C are block diagrams illustrating read training operations for a memory device 360 of a buffer device 340, and FIGS. 6D and 6E are block diagrams for explaining write training operations for the memory device 360 of the buffer device 340.

As described in the previous paragraphs discussing the flowchart of FIG. 5, training operations for the memory device 360 of the buffer device 340 may be performed simultaneously with the training operations for the buffer device 340 of the memory controller 320, and the training operations for the buffer device 340 of the memory controller 320 have been described in detail with reference to FIGS. 3A through 3D and thus, descriptions thereof will be omitted.

Referring now to FIG. 6A, a memory module 300 may include a buffer device 340 and a memory device 360. The buffer device 340 may include a training block TB, and the training block TB may include a pattern data generator 342 and a clock generator 349. The memory device 360 may include a memory cell array 362 into/from which predetermined data is written/read.

The training block TB may transmit a third pattern data PT_D3 generated by the pattern data generator 342 to the memory device 360 via a data signal line. The training block TB may transmit to the memory device 360 a data strobe signal $DQS_{FL}$ having a sufficiently low frequency at which a miss-match does not occur due to skew with the transmitted third pattern data PT_D3. In an embodiment of the inventive concept, the training block TB may divide a clock signal generated by the clock generator 349 to generate a data strobe signal $DQS_{FL}$ having a low frequency. The memory device 360 may sample third pattern data PT_D3 using the data strobe signal $DQS_{FL}$ to write the third pattern data PT_D3.

In another embodiment of the inventive concept, referring to FIG. 6B, the training block TB may not include the clock generator 349 but may receive a data strobe signal DQS' from the memory controller, or may receive a clock signal CLK_EXT from an external clock source. Accordingly, the buffer device 340 may receive the data strobe signal DQS' or the clock signal CLK_EXT from the outside and may perform training operations for the memory device using the data strobe signal DQS' and the clock signal CLK_EXT.

Referring now to FIG. 6C, the training block TB may further include a sampling circuit 343, a comparison circuit 346, a delay adjusting circuit 347, and a signal delay circuit 344. The memory device 360 may transmit a signal generated by sampling the third pattern data PT_D3 as a third read training data RT_D3 to the sampling circuit 343, as described in FIG. 6A, and may transmit a data strobe signal DQS having a high frequency. In an example, the data strobe signal DQS of FIG. 6C may have the same frequency as that of a data strobe signal used in a read operation.

The sampling circuit 343 may receive a delayed data strobe signal D_DQS from the signal delay circuit 344 and may sample the third read training data RT_D3 using the delayed data strobe signal D_DQS to generate a third sampling data SAMPLE_D3. The comparison circuit 346 may compare the third pattern data PT_D3 with the third sampling data SAMPLE_D3 to generate a third comparison result COM_R3. The delay adjusting circuit 347 may generate a third delay control signal D_CS3 used to control a degree of delay of the signal delay circuit 344 based on the third comparison result COM_R3. The signal delay circuit 344 may change a degree of delay based on the third delay control signal D_CS3 to delay the data strobe signal DQS.

The training block TB may perform the operations described in FIGS. 6A through 6C as part of read training operations for the memory device 360 repeatedly for a plurality of times. The delay adjusting circuit 347 may generate a third timing compensation information TCI3 based on the third comparison result COM_R3, and the third timing compensation information TCI3 may be stored in register 345. Descriptions of the third timing compensation information TCI3 are the same as the above descriptions and thus, detailed descriptions thereof will be omitted.

Referring now to FIG. 6D, the training block TB may transmit the fourth pattern data PT_D4 to the memory device 360 via a data signal line. The training block TB may provide a data strobe signal DQS having a high frequency to the memory device 360 via a data strobe signal line. In an example, the data strobe signal DQS may have the same frequency as that of a data strobe signal used in a write operation. The memory device 360 may sample the fourth pattern data PT_D4 using the data strobe signal DQS to write the fourth pattern data PT_D4 into the memory cell array 362.

Referring now to FIG. 6E, the training block TB may further include a compensation circuit 348 (as compared with FIG. 6C). The memory device 360 may transmit a signal generated by sampling the fourth pattern data PT_D4 as fourth write training data WT_D4 to the sampling circuit 343, as previously described in FIG. 6D, and may transmit a data strobe signal DQS having a high frequency to the compensation circuit 348. In an example, the data strobe signal DQS may have the same frequency as that of a data strobe signal used in a read operation.

The compensation circuit 348 may compensate for the timing of the data strobe signal DQS by referring to the third timing compensation information TCI3 to generate compensated data strobe signal C_DQS. The sampling circuit 343 may sample the fourth write training data WT_D4 using the compensated data strobe signal C_DQS to generate a fourth sampling data SAMPLE_D4. The comparison circuit 346 may compare the fourth pattern data PT_D4 with the fourth sampling data SAMPLE_D4 to generate a fourth comparison result COM_R4. The delay adjusting circuit 347 may generate a fourth delay control signal D_CS4 used to control a degree of delay of the signal delay circuit 344 based on the fourth comparison result COM_R4. The signal delay circuit 344 may change a degree of delay based on the fourth delay control signal D_CS4, may delay the data strobe signal DQS, and may transmit a delayed data strobe signal D_DQS to the buffer device 340 via a data strobe signal line.

The training block TB may perform an operation loop described in FIGS. 6D and 6E as part of write training operations for the memory device 360 for a plurality of times. The delay adjusting circuit 347 may generate a fourth timing compensation information TCI4 based on the fourth comparison result COM_R4. Descriptions of the fourth timing compensation information TCI4 are the same as the above descriptions, and hereinafter, detailed descriptions thereof will be omitted.

Figure 7:
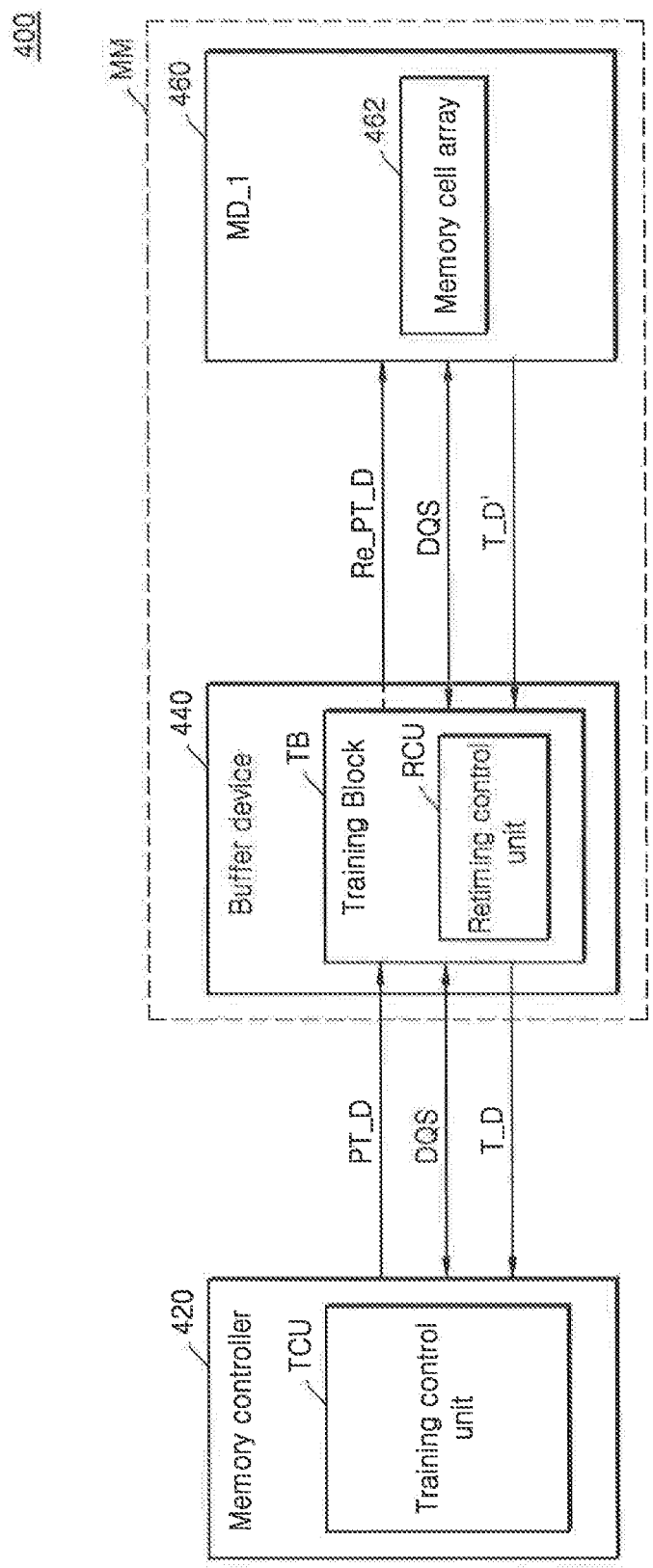
FIG. 7 is a block diagram illustrating training operations of the memory devices when the buffer device according to an embodiment of the inventive concept supports a re-timing function.
Figure 8A:
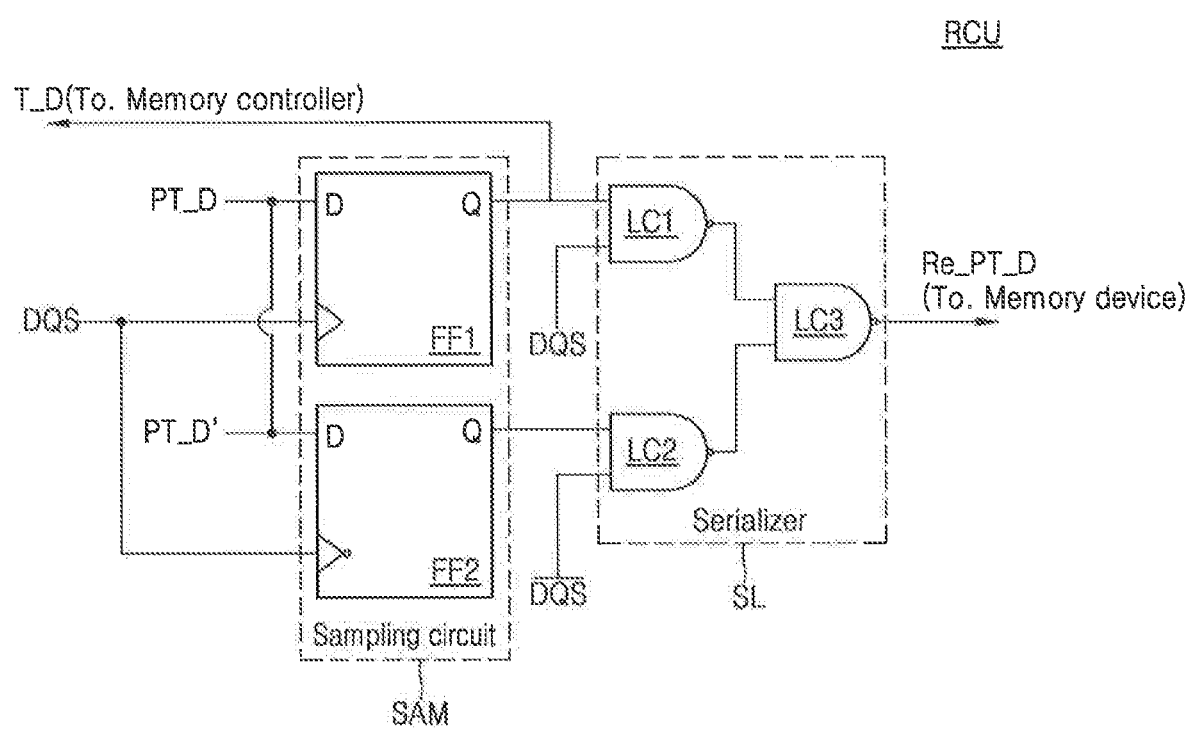
FIGS. 8A and 8B are views illustrating configuration and operations of a re-timing controller of the buffer device.
Figure 8B:
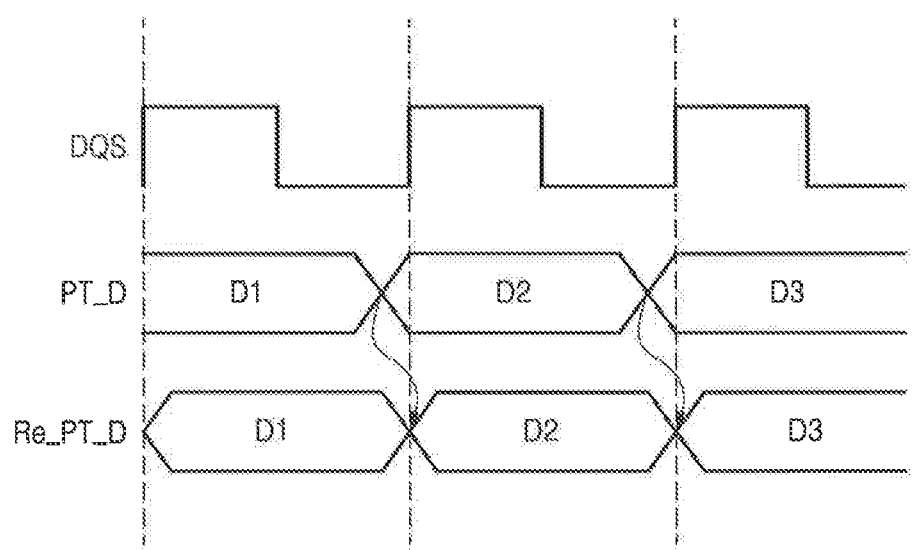

FIG. 7 is a block diagram illustrating training operations of the memory device 360 when a buffer device 440 according to an embodiment of the inventive concept supports a re-timing function, and FIGS. 8A and 8B are views illustrating an example of configuration and operations of a retiming control unit (RCU) of the buffer device 440.

Referring to FIG. 7, a memory system 400 may include a memory controller 420 and a memory module MM, and the memory module MM may include a buffer device 440 and a memory device 460. The buffer device 440 may further include the retiming control unit (RCU), unlike in the buffer device 340 previously-described in FIG. 6A and the like. The RCU may re-align a data signal and a data strobe signal received from the memory controller 420, and the RCU may provide the data signal and the data strobe signal, which are re-aligned in the memory device 460, to the memory device 460. By using the RCU, skews of the data signal and the data strobe signal generated between the memory controller 420 and the buffer device 440 are compensated for by re-aligning the data signal and the strobe signal. Thus, the buffer device 440 may transmit the data signal and the data strobe signal to the memory device 460 in consideration of only signal transmission characteristics between the buffer device 440 and the memory device 460. When the buffer device 440 performs training operations for the memory device 460, the above retiming function may be used.

Referring now to FIG. 8A, the RCU may include a sampling circuit SAM and a serializer SL (or a multiplexer). The sampling circuit SAM may include, for example, a first flip-flop FF1 and a second flip-flop FF2, and the serializer SL may include a plurality of logic circuits LC1 to LC3. In an example, the logic circuits LC1 to LC3 may be NAND gates. The first flip-flop FF1 and the second flip-flop FF2 may receive pattern data PT_D from the memory controller 420 via a first terminal. Also, the first flip-flop FF1 and the second flip-flop FF2 may receive a data strobe signal DQS and a data strobe inverting signal /DQS from the memory controller 420 via a second terminal. Each of the first flip-flop FF1 and the second flip-flop FF2 may transmit an output signal to the serializer SL via an output terminal. Simultaneously, the first flip-flop FF1 may transmit a signal generated by sampling the pattern data PT_D using the data strobe signal DQS, as training data T_D to the memory controller 420. The training data T_D may be used in training operations for the buffer device 440.

The serializer SL may generate a retiming pattern data Re_PT_D using output signals received from the sampling circuit SAM, the data strobe signal DQS, and the data strobe inverting signal /DQS. Referring to FIG. 8B, the pattern data PT_D may include first through third data D1 to D3, and the serializer SL may re-align the first through third data D1 to D3 based on the data strobe signal DQS. In an example, the serializer SL may re-align the first through third data D1 to D3 according to a rising edge of the data strobe signal DQS and may generate retiming pattern data Re_PT_D. Referring back to FIG. 8A, the serializer SL may transmit the retiming pattern data Re_PT_D to the memory device 460. The retiming pattern data Re_PT_D may be used in training operations for the memory device 460. Furthermore, the memory device 460 may generate training data T_D' used in the training operations for the memory device 460 to the buffer device 440 based on the retiming pattern data Re_PT_D.

Accordingly, by use of the RCU, training operations for the buffer device 440 and training operations for the memory device 460 may be simultaneously performed. Also, the buffer device 440 may perform the training operations for the memory device 460 using the pattern data PT_D and the data strobe signal DQS, which is received from the memory controller 420. Thus, the buffer device 440 may not include an additional pattern data generator and an additional clock generator, which may result in the size of the buffer device 440 being minimized.

Figure 9:
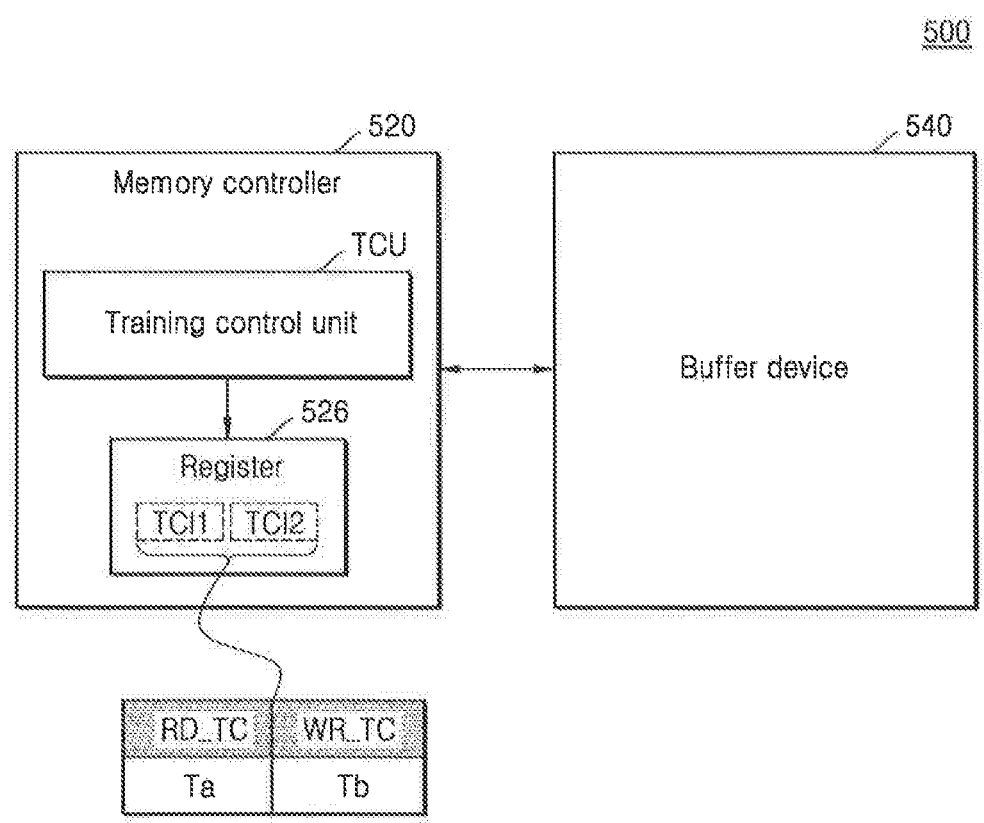
FIG. 9 is a block diagram illustrating training operations of a buffer device of a memory controller, wherein the buffer device generates timing compensation information, according to an embodiment of the inventive concept.

FIG. 9 is a block diagram illustrating training operations for a buffer device 540 of a memory controller 520 that generates timing compensation information according to an embodiment of the inventive concept.

Referring now to FIG. 9, a memory system 500 may include a memory controller 520 and a buffer device 540. As described above, a training control unit TCU of the memory controller 520 may perform read/write training operations for the buffer device 540. As a result, the TCU may generate a first timing compensation information TCI1 and a second timing compensation information TCI2. The TCU may store the timing compensation information TCI1 and TCI2 in a register 526 of the memory controller 520. In an example, the timing compensation information TCI1 and TCI2 may indicate a degree of timing compensation WR_TC for a signal (for example, a data signal or a data strobe signal) transmitted by the memory controller 520 to the buffer device 540 for a write operation and a degree of timing compensation RD_TC for a signal (for example, a data signal or a data strobe signal) received by the memory controller 520 from the buffer device 540 for a read operation. Subsequently, the memory controller 520 may perform a memory operation by referring to the timing compensation information TCI1 and TCI2 stored in the register 526.

Figure 10A:
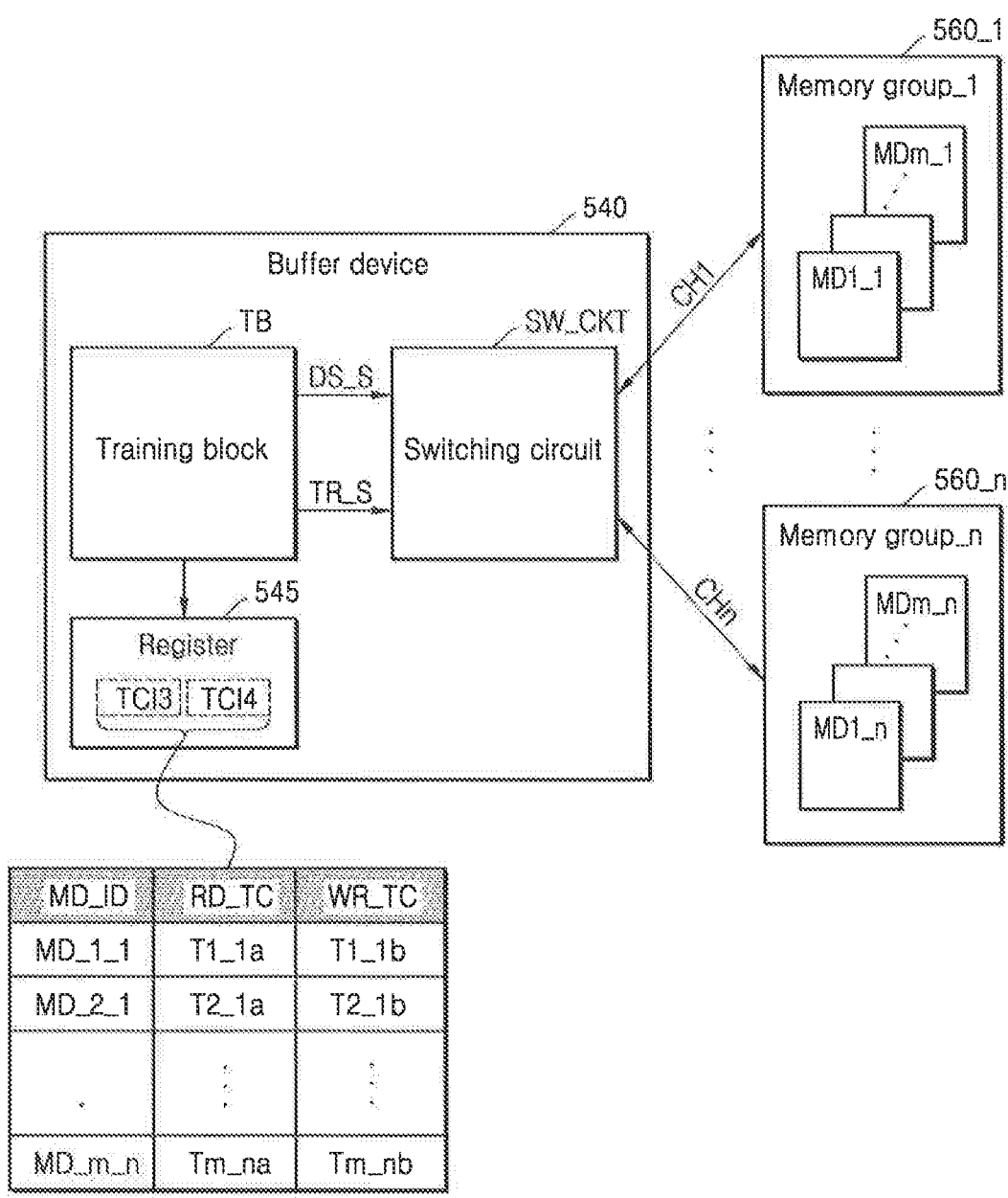
FIGS. 10A and 10B are block diagrams illustrating training operations for memory groups of the buffer device that generates timing compensation information, according to an embodiment of the inventive concept.
Figure 10B:
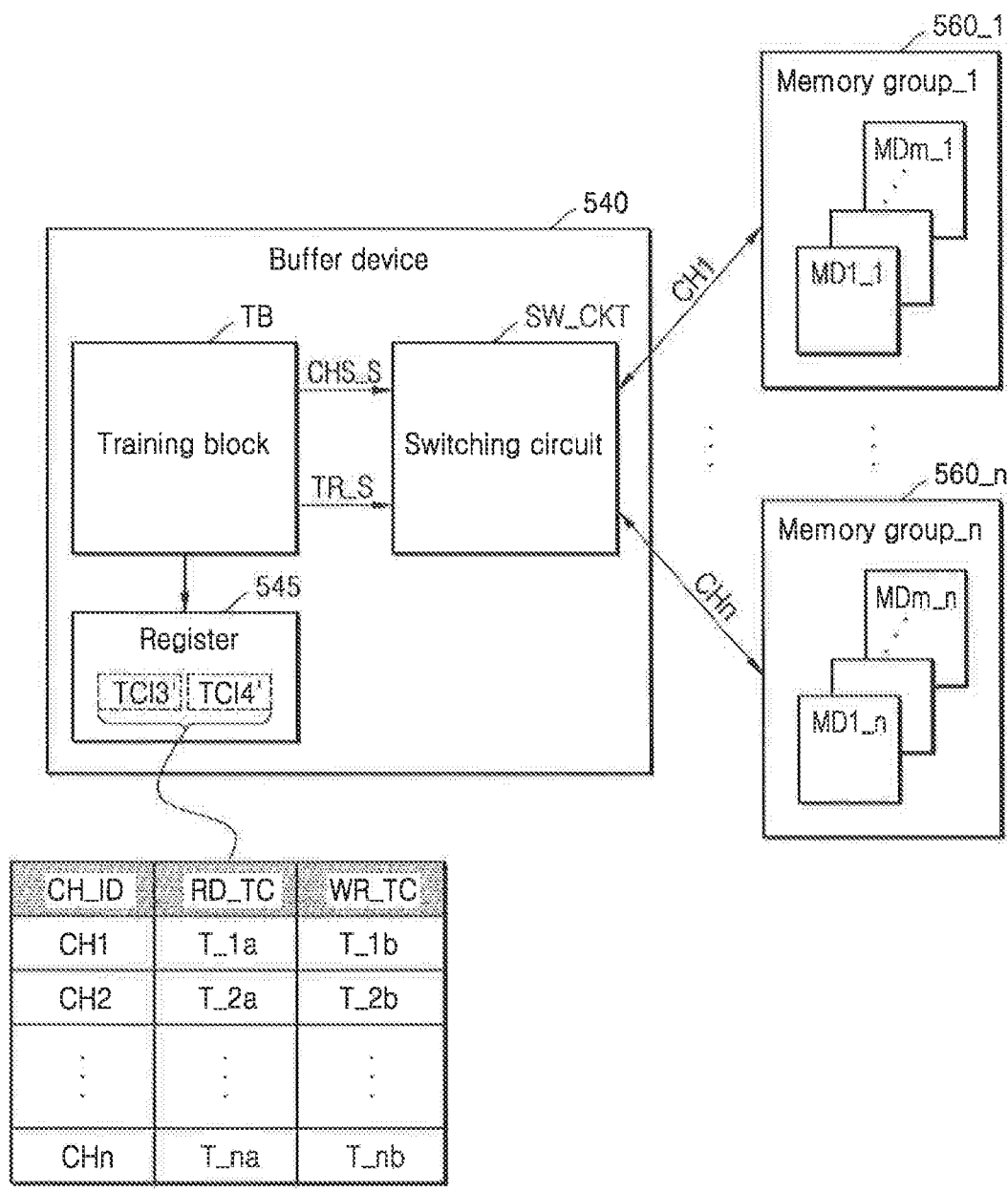

FIGS. 10A and 10B are block diagrams illustrating training operations for memory groups 560_1 to 560_n of a buffer device 540 that generates timing compensation information according to an embodiment of the inventive concept.

Referring now to FIG. 10A, a memory system 500 may include the buffer device 540 and a plurality of memory groups 560_1 to 560_n. Each of the plurality of memory groups 560_1 to 560_n may include a plurality of memory devices. Each of the memory groups 560_1 to 560_n may be connected to the buffer device 540 via channels CH1 to CHn.

As described above, the training block TB of the buffer device 540 may perform read/write training operations for the memory groups 560_1 to 560_n. In an embodiment, the buffer device 540 may further include a switching circuit SW_CKT and may be selectively connected to each of the memory groups 560_1 to 560_n via a switching circuit SW_CKT. The training block TB may transmit a selection signal DS_S for selecting a particular memory device as a training object from among a plurality of memory devices to the switching circuit SW_CKT together with a training-related signal TR_S. The switching circuit SW_CKT may connect a memory group in which the memory device selected based on the selection signal DS_S is included, to the buffer device 540 via a channel. For example, when a memory device MD1_1 is selected as a training object, the switching circuit SW_CKT may connect a first memory group 560_1 to the buffer device 540 via a first channel CH1. Subsequently, the selection signal DS_S may be transmitted to memory devices of the first memory group 560_1 via the first channel CH1, and only the memory device MD1_1 corresponding to the selection signal DS_S is enabled so that the training block TB may perform training operations for the memory device MD1_1. However, the aforementioned description pertains to an embodiment of the inventive concept. Thus, other embodiments of the inventive concept are not limited thereto, and the training block TB may perform training operations for a memory device by selecting the memory device in various ways.

Accordingly, the training block TB may perform training operations for the memory groups 560_1 to 560_n. As a result, the training block TB may generate a third timing compensation information TCI3 and a fourth timing compensation information TCI4. The training block TB may store the timing compensation information TCI3 and TCI4 in a register 545 of the buffer device 540. Subsequently, the buffer device 540 may perform a memory operation (e.g., a read operation or a write operation) with reference to the timing compensation information of TCI3 and TCI4 stored in the register 545.

In an example, the timing compensation information TCI3 and TCI4 may indicate a degree of timing compensation WR_TC for a signal (for example, a data signal or a data strobe signal) transmitted by the buffer device 540 to a memory device for a write operation and a degree of timing compensation RD_TC for a signal (for example, a data signal or a data strobe signal) received by the buffer device 540 from the memory device for a read operation according to memory devices MD_1_1 to MD_m_n. Subsequently, the buffer device 540 may perform a memory operation by referring to the timing compensation information TCI3 and TCI4 stored in the register 545.

When a memory operation is performed at a low frequency that is equal to or less than a threshold frequency value, skew may occur due to characteristics of each channel rather than characteristics of each memory device. Thus, skew generation patterns of signals to be transmitted/received between the memory devices included in the same memory groups 560_1 to 560_n and the buffer device 540 may be the same or similar. In FIG. 10B, unlike in FIG. 10A, timing compensation information TCI3' and TCI4' generated as a result of performing training operations for the memory groups 560_1 to 560_n may indicate a degree of a timing compensation WR_TC for a signal (for example, a data signal or a data strobe signal) transmitted by the buffer device 540 to the memory device for a write operation. In addition, a degree of timing compensation RD_TC may be indicated for a signal (for example, a data signal or a data strobe signal) received by the buffer device 540 from the memory device for a read operation according to channels CH1 to CHn.

In an embodiment of the inventive concept, the training block TB may generate timing compensation information corresponding to a first channel CH1 after performing training operations for a first memory group 560_1 connected to the first channel CH1 is completed. Of course, unlike in FIG. 10A, in FIG. 10B, a data strobe signal used when the training block TB performs training operations, may have a low frequency that is equal to or less than a threshold value. In detail, the training operations are performed for only one memory device included in a first memory group 560_1 so that timing compensation information corresponding to the first channel CH1 may be generated, or training operations may be performed for at least two memory devices included in the first memory group 560_1, and an average of the generated timing compensation information may be generated as timing compensation information corresponding to the first channel CH1. Accordingly, the training block TB may generate timing compensation information corresponding to second through n-th channels CH2 to CHn to store the generated timing compensation information in the register 545. Other embodiments of the inventive concept are not limited to the aforementioned embodiment, as the timing compensation information may be generated according to channels in various ways. Subsequently, the buffer device 540 may perform a memory operation based on a low frequency that is equal to or less than a threshold value by referring to the timing compensation information TCI3' and TCI4' stored in the register 545.

Figure 11:
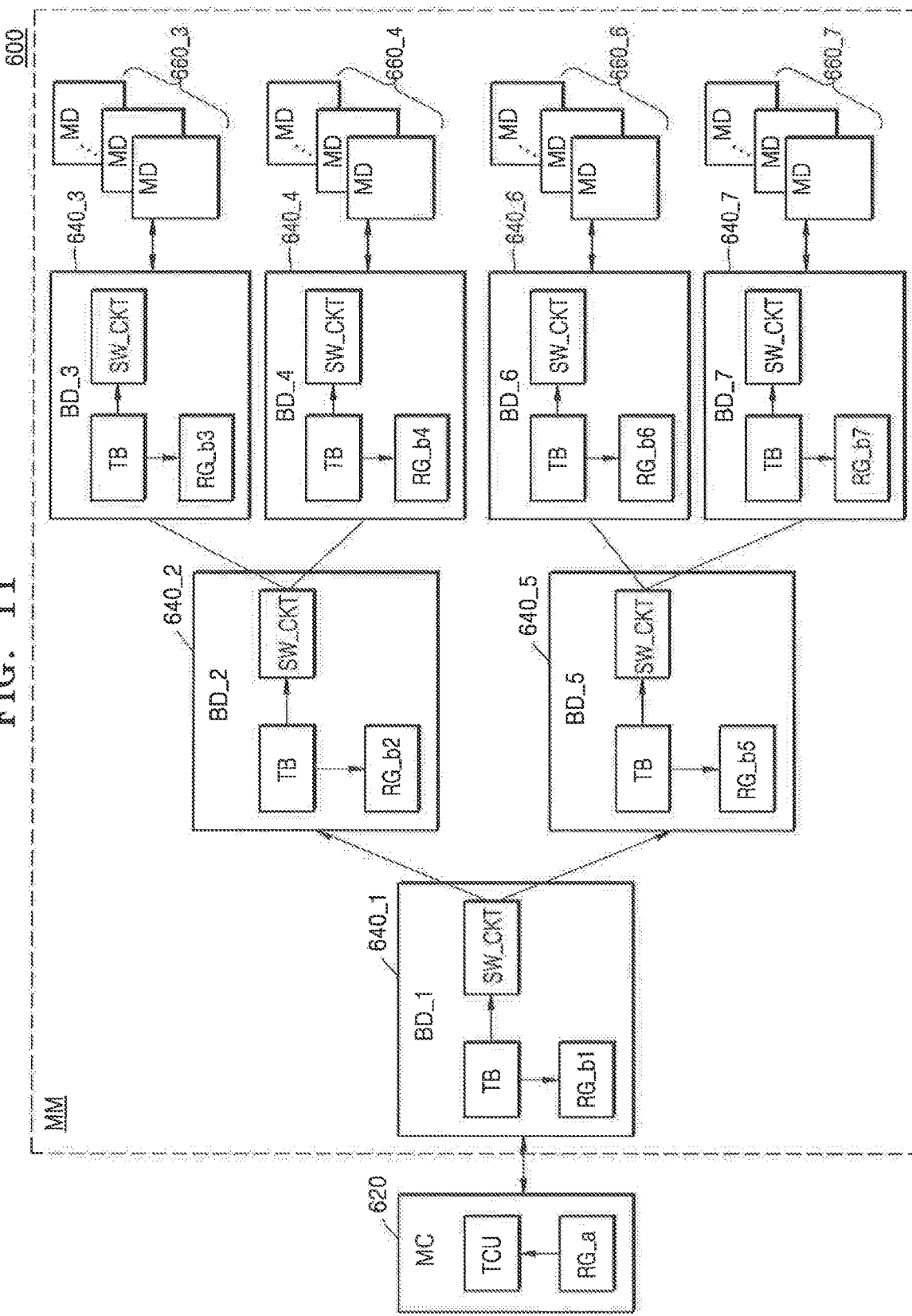
FIG. 11 is a block diagram of a memory system according to an embodiment of the inventive concept.

FIG. 11 is a block diagram of a memory system 600 according to an embodiment of the inventive concept.

Referring to FIG. 11, the memory system 600 may include a memory controller 620 and a memory module MM, and the memory module MM may include a plurality of buffer devices 640_1 to 640_7 and a plurality of memory devices 660_3 to 660_7. The memory controller 620 may perform training operations for a first buffer device 640_1 using a training control unit (TCU) and may store timing compensation information generated as a result of performing the training operations in a register RG_a.

In an embodiment of the inventive concept, the buffer devices 640_1 to 640_7 may form a predetermined tree structure. As shown in FIG. 11, each of the buffer devices 640_1 to 640_7 may include a respective switching circuit SW_CKT. The first buffer device 640_1 may be connected to a second buffer device 640_2 and a fifth buffer device 640_5 via a switching circuit SW_CKT. The second buffer device 640_2 and the fifth buffer device 640_5, which are connected to the first buffer device 640_1, may be referred to as a sub-buffer device for the first buffer device 640_1, and the first buffer device 640_1 may be referred to as a main buffer device. The first buffer device 640_1 may perform training operations for the second buffer device 640_2 and the fifth buffer device 640_5 using the training block TB, as in the above-described embodiments, and may store timing compensation information generated as a result of performing the training operations in a register RG_b1.

Also, the second buffer device 640_1 may be connected to a third buffer device 640_3 and a fourth buffer device 640_4 via a switching circuit SW_CKT. The third buffer device 640_3 and the fourth buffer device 640_4, which are connected to the second buffer device 640_2, may be referred to as a sub-buffer device for the second buffer device 640_2, and the second buffer device 640_2 may be referred to as a main buffer device. The third buffer device 640_3 may be connected to first memory devices 660_3 via the switching circuit SW_CKT, and the fourth buffer device 640_4 may be connected to second memory devices 660_4 via the switching circuit SW_CKT. The second buffer device 640_2 may perform training operations for the third buffer device 640_3 and the fourth buffer device 640_4 using the training block TB, as in the above-described embodiments and may store timing compensation information generated as a result of performing the training operations. The third buffer device 640_3 and the fourth buffer device 640_4 may perform training operations for the first and second corresponding memory devices 660_3 and 660_4 using the training block TB and may store timing compensation information generated as a result of performing the training operations in registers RG_b3 and RG_b4. The relationship between fifth through seventh buffer devices 640_5 to 640_7 and third memory devices 660_6 and fourth memory devices 660_7 are similar to the relationship between the second through fourth buffer devices 640_2 to 640_4 and the first and second memory devices 660_3 and 660_4 and thus, detailed descriptions thereof will be omitted. In addition, while each of the buffer devices shown in FIG. 11 have their own switching circuit, it is within the inventive concept there could be other configurations, for example, a switch could be arranged that receives the input of more than one buffer device.

Figure 12:
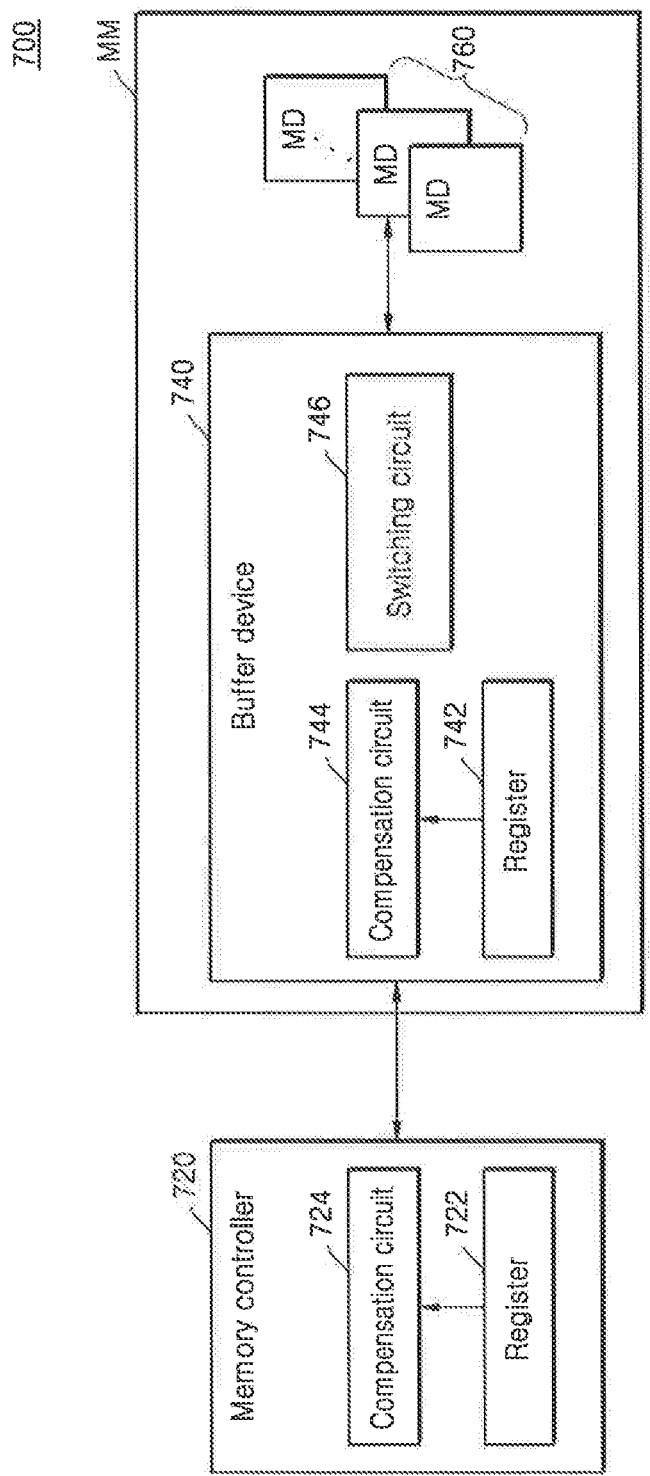
FIG. 12 is a block diagram illustrating a memory operating method of a memory system, according to an embodiment of the inventive concept.

FIG. 12 is a block diagram shown to illustrate a memory operating method of a memory system 700 according to an embodiment of the inventive concept.

Referring to FIG. 12, the memory system 700 may include a memory controller 720 and a memory module MM, and the memory module MM may include at least one buffer device 740 and a plurality of memory devices 760. The memory controller 720 may include a register 722 and a compensation circuit 724. As described above, timing compensation information generated as a result of performing training operations for the buffer device 740 may be stored in the register 722. The compensation circuit 724 may compensate for timing for signals to be transmitted to the buffer device 740 by referring to the timing compensation information in the register 722, and then may transmit the signals to the buffer device 740. Also, the compensation circuit 724 may compensate for timing for the signals received from the buffer device 740 by referring to the timing compensation information in the register 722.

The buffer device 740 may include a register 742, a compensation circuit 744, and a switching circuit 746. As described above, timing compensation information generated as a result of performing the training operations for the memory devices 760 may be stored in the register 742. The compensation circuit 744 may compensate for timing of the signals to be transmitted to the memory devices 760 by referring to the timing compensation information in the register 742 and then may transmit the signals to the memory devices 760. Also, the compensation circuit 744 may compensate for timing for the signals received from the memory devices 760.

The memory system 700 according to an embodiment of the inventive concept may perform a memory operation including a timing-compensating information for the above signals.

Figure 13A:
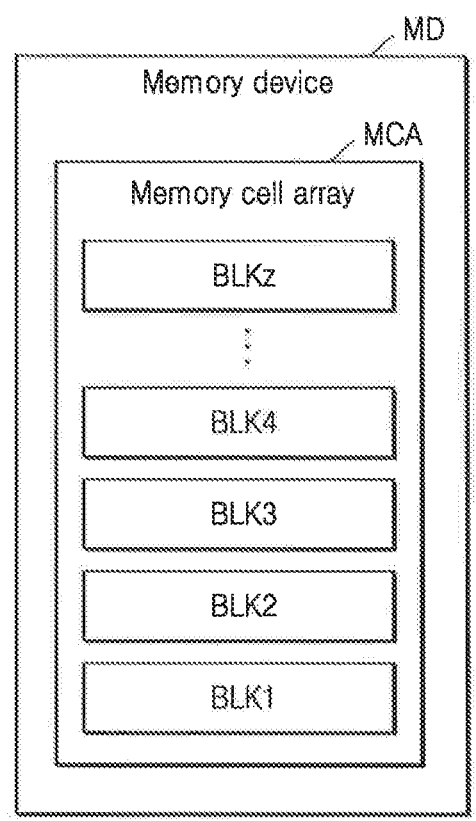
FIGS. 13A and 13B are views illustrating an embodiment of the memory device of FIG. 1.
Figure 13B:
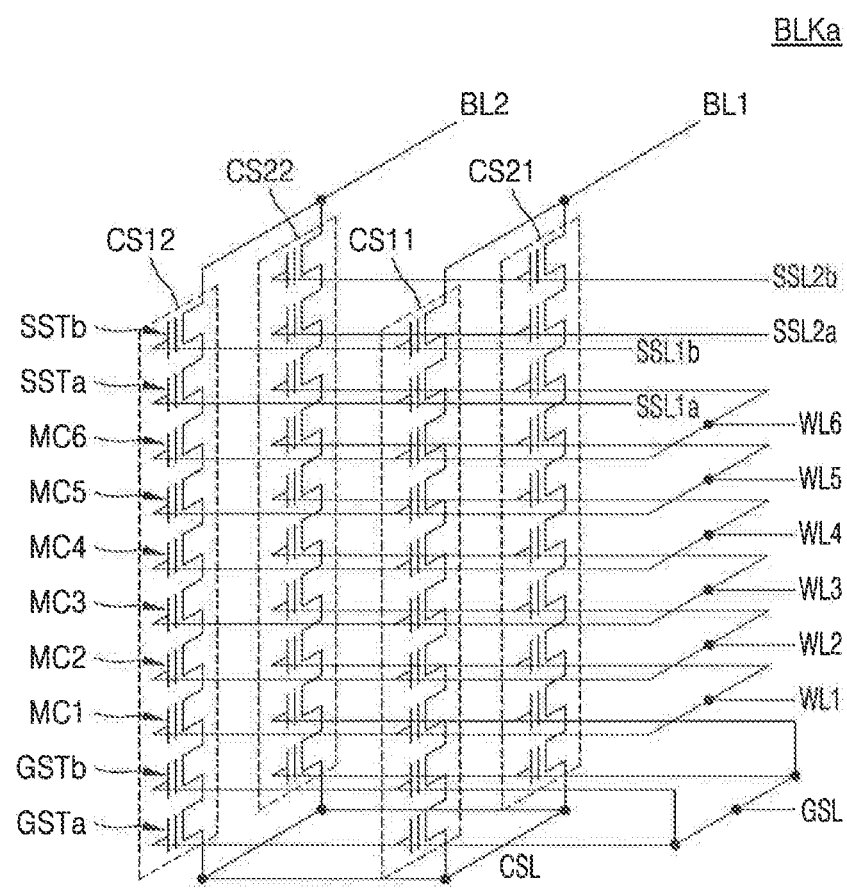

FIGS. 13A and 13B are views illustrating an embodiment of the memory device 160.

Referring to FIG. 13A, a memory device MD may include a memory cell array MCA, and the memory cell array MCA may include a plurality of memory blocks BLK1 to BLKz.

Referring to FIG. 13B, a memory block BLKa may include a plurality of cell strings CS11 to CS21, and CS12 to CS22. The plurality of cell strings CS11 to CS21, and CS12 to CS22 may be arranged along a row direction and a column direction and may form rows and columns. For example, the cell strings CS11 and CS12 arranged along the row direction may form a first row, and the cell strings CS21 and CS22 arranged along the row direction may form a second row. The cell strings CS11 and CS21 arranged in a column direction may form a first row, and the cell strings CS12 and CS22 arranged in the column direction may form a second row. Each of the cell strings CS11 and CS12 and CS21 and CS22 may include a plurality of cell transistors. The plurality of cell transistors may include ground selection transistors GSTa and GSTb, memory cells MC1 to MC6, and string selection transistors SSTa and SSTb. The ground selection transistors GSTa and GSTb, the memory cells MC1 to MC6, and the string selection transistors SSTa and GSTb of each cell string may be stacked in a direction of a height perpendicular to a plane (for example, a plane of a substrate of the memory block BLKa) in which the cell strings CS11 to CS21 and CS12 to CS22 are arranged along rows and columns.

With continued reference to FIG. 13B, the plurality of cell transistors may be, for example, charge trap type transistors having threshold voltages that change according to the amount of charges captured in an insulating layer. The bottommost ground selection transistors GSTa may be commonly connected to a common source line CSL. The ground selection transistors GSTa and GSTb of the plurality of cell strings CS11 to CS21 and CS12 to CS22 may be commonly connected to a ground selection line GSL. Memory cells disposed at the same height (or order) from the substrate (or the ground selection transistors GST) may be commonly connected to one wordline, and memory cells disposed at different heights (or orders) may be connected to different wordlines WL1 to WL6. In first string selection transistors SSTa at the same heights (or orders) of the plurality of cell strings CS11 to CS21 and CS12 to CS22, the first string selection transistors SSTa in different rows may be connected to different string selection lines SSL1a to SSL2a. In second string selection transistors SSTb at the same heights (or orders) of the plurality of cell strings CS11 to CS21 and CS12 to CS22, the second string selection transistors SSTb in different rows may be connected to different string selection lines SSL1b to SSL2b.

Figure 14:
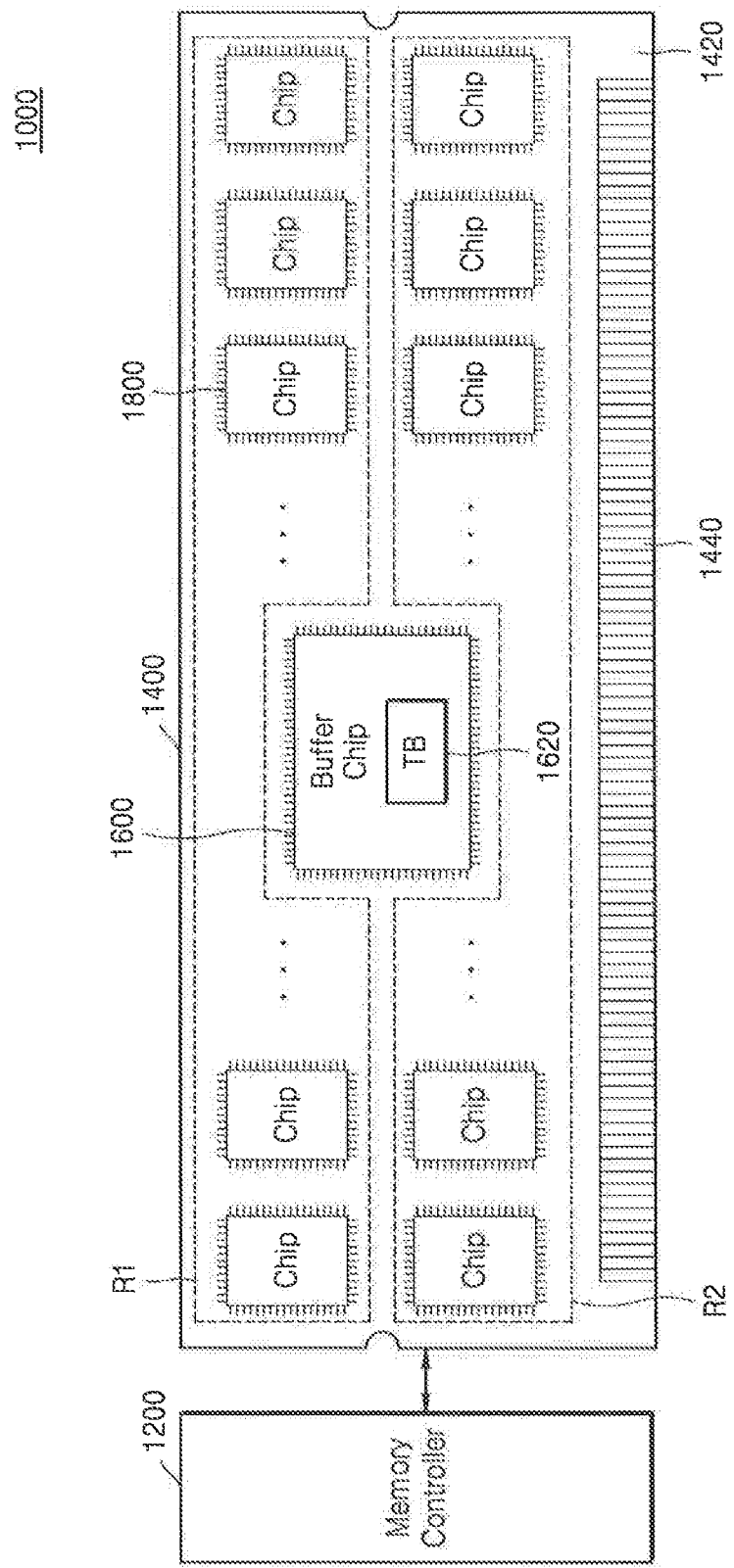
FIG. 14 is a block diagram of a memory system according to an embodiment of the inventive concept.

FIG. 14 is a block diagram of a memory system 1000 according to an embodiment of the inventive concept.

Referring to FIG. 14, the memory system 1000 may include a memory controller 1200 and a memory module 1400. The memory module 1400 may include at least one memory chip 1800 each including a memory cell array and a buffer chip 1600 for routing transmission/reception signals between the memory chips 1800 and the memory controller 1200 or managing a memory operation for the memory chips 1800. The memory chips 1800 of the memory module 1400 may be classified into a first rank R1 and a second rank R2. The buffer chip 1600 may include a training block 1620.

The training block 1620, which is part of the buffer chip 1600, may perform training operations for the memory chips 1800 when embodiments such as described in FIGS. 1 through 11 are applied to the training block 1620. In the example of FIG. 14, a portion of a function of the memory controller 1200 is performed in a memory module having an LRDIMM shape. However, embodiments of the inventive concept are not limited thereto. For example, as a memory module having an FBDIMM shape is used, an advanced memory buffer (AMB) chip as a buffer chip may also be mounted on a memory module. Also, a memory module having a different shape may be used, and at least a portion of a function of the above-described memory controller may be performed.

According to this embodiment of the inventive concept, training operations for a plurality of memory chips 1800 may be performed in different ways according to the elements of the buffer chip 1600.

For example, if the buffer chip 1600 does not include a decision circuit, the memory controller 1200 may perform training operations for the memory chips 1800 using the buffer chip after performing training operations with the buffer chip.

In another example, if the buffer chip 1600 includes the decision circuit, the buffer chip may independently perform the training operations for the memory devices with the memory controller 1200. Furthermore, training operations between the memory controller 1200 and the buffer chip 1600, and training operations between the buffer chip and the memory chips 1800 can be simultaneously performed. By the performance of simultaneous training operations, a time required for the training operations can be reduced.

Figure 15:
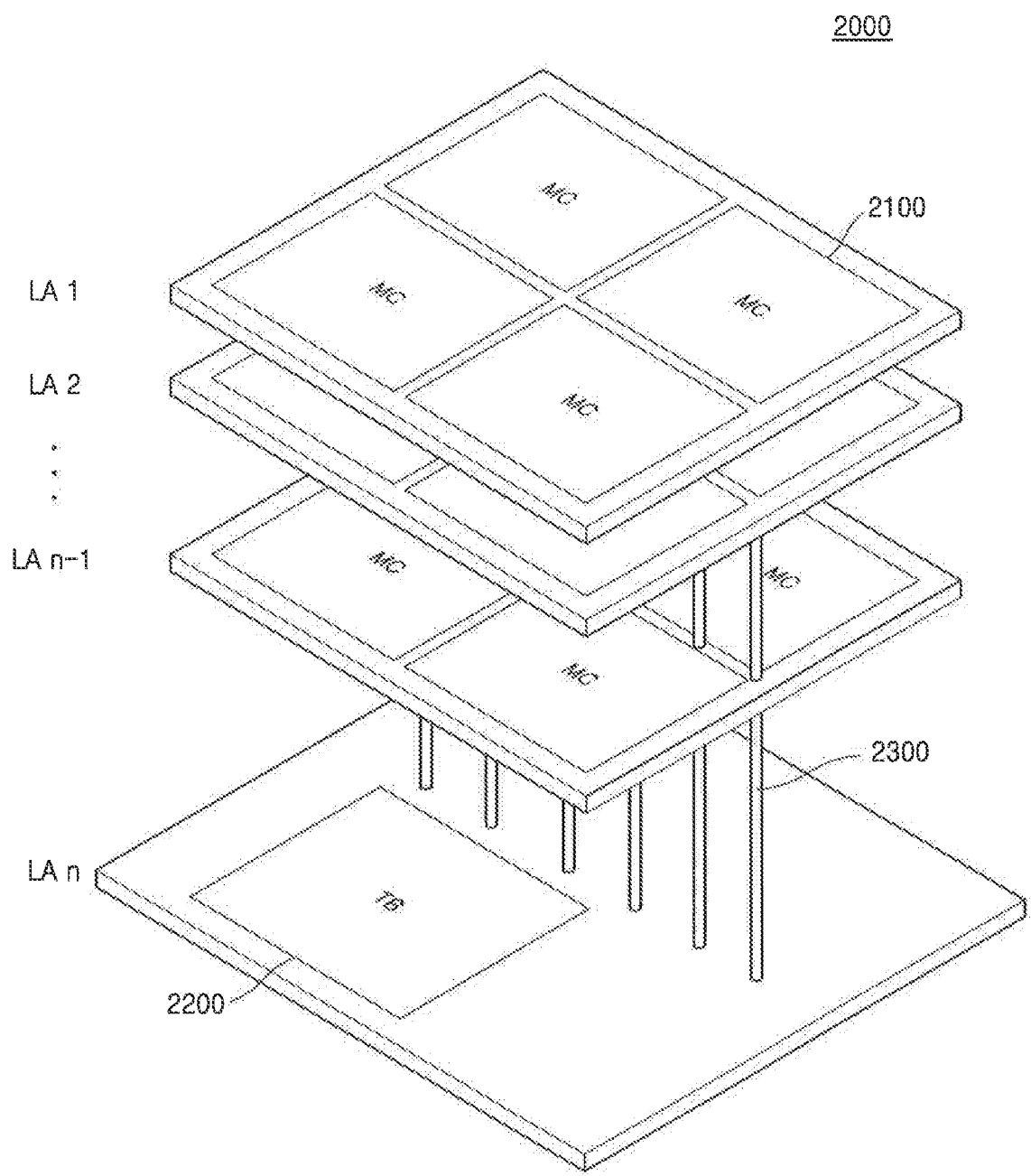
FIG. 15 is a block diagram of a semiconductor package which has a stacked structure including a plurality of layers, according to an embodiment of the inventive concept.

FIG. 15 is a block diagram of a semiconductor package 2000 having a stack structure including a plurality of layers according to an embodiment of the inventive concept.

Referring to FIG. 15, the semiconductor package 2000 may include a plurality of layers LA1 to LAn. Each of first through (n-1)th layers LA through LAn-1 may be a memory layer (or a memory chip) including a plurality of memory cores MC. The plurality of memory cores MC may include a memory cell array, a row decoder, a column decoder, and a sense amplifier for storing data. An nth layer LAn may be a buffer layer (or a buffer chip). Layers LA1 through LAn having the stack structure in the semiconductor package 2000 may be connected to one another via a through silicon via (TSV) 2300.

The buffer layer LAn may communicate with an external memory controller and memory layers LA1 to LAn-1 and may route transmission/reception signals between the memory layers LA1 to LAn-1 and the memory controller. Furthermore, the buffer layer LAn may queue signals received from the memory controller or the memory layers LA1 to LAn-1.

Also, the buffer layer LAn may include a training block 2200. The buffer layer LAn may perform training operations for the memory layers LA1 to LAn-1 using the training block 2200. The embodiments described in FIGS. 1 through 11 may be applied to a training operating method of the buffer layer LAn. In an embodiment, the buffer layer LAn may perform training operations for the memory layers LA1 to LAn-1 and may generate timing compensation information for transmission/reception signals between the base layer LAn and the memory layers LA1 to LAn-1 according to memory cores MC.

Figure 16:
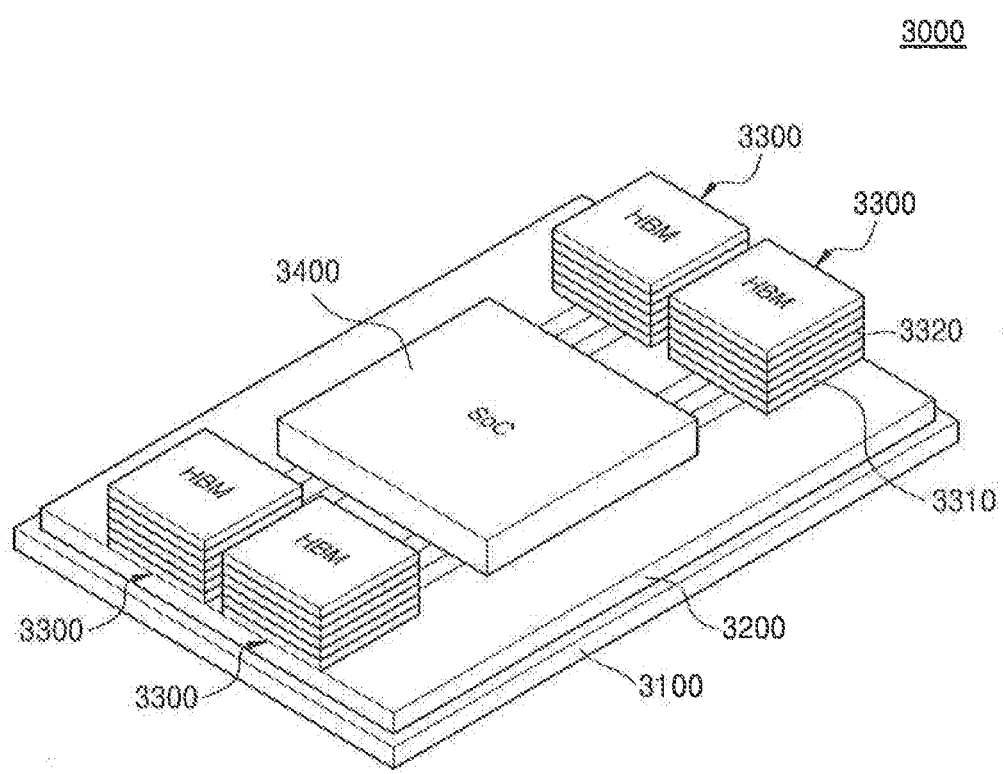
FIG. 16 is a view of a semiconductor package including a stacked semiconductor chip, according to an embodiment of the inventive concept.

FIG. 16 is a view of a semiconductor package including a stack semiconductor chip according to an embodiment of the inventive concept.

Referring to FIG. 16, the semiconductor package 3000 may be a memory module including at least one stack semiconductor chip 3300 mounted on a package substrate 3100, such as a printed circuit board (PCB), and a system-on-chip (SOC) 3400. An interposer 3200 may be optionally provided onto the package substrate 3100. The stack semiconductor chip 3300 may be formed as a chip-on-chip (COC). The stack semiconductor chip 3300 may include at least one memory chip 3320 stacked on a buffer chip 3310 such as a logic chip. The buffer chip 3310 and at least one memory chip 3320 may be connected to each other via a TSV. The buffer chip 3310 may perform training operations for the memory chip 3320, and the embodiments such as described in FIGS. 1 through 11 may be applied to the training-operating method of the buffer chip 3310. The stack semiconductor chip 3300 may be a high bandwidth memory (HBM) of 500 GB/sec to 1 TB/sec or higher, for example.

Figure 17:
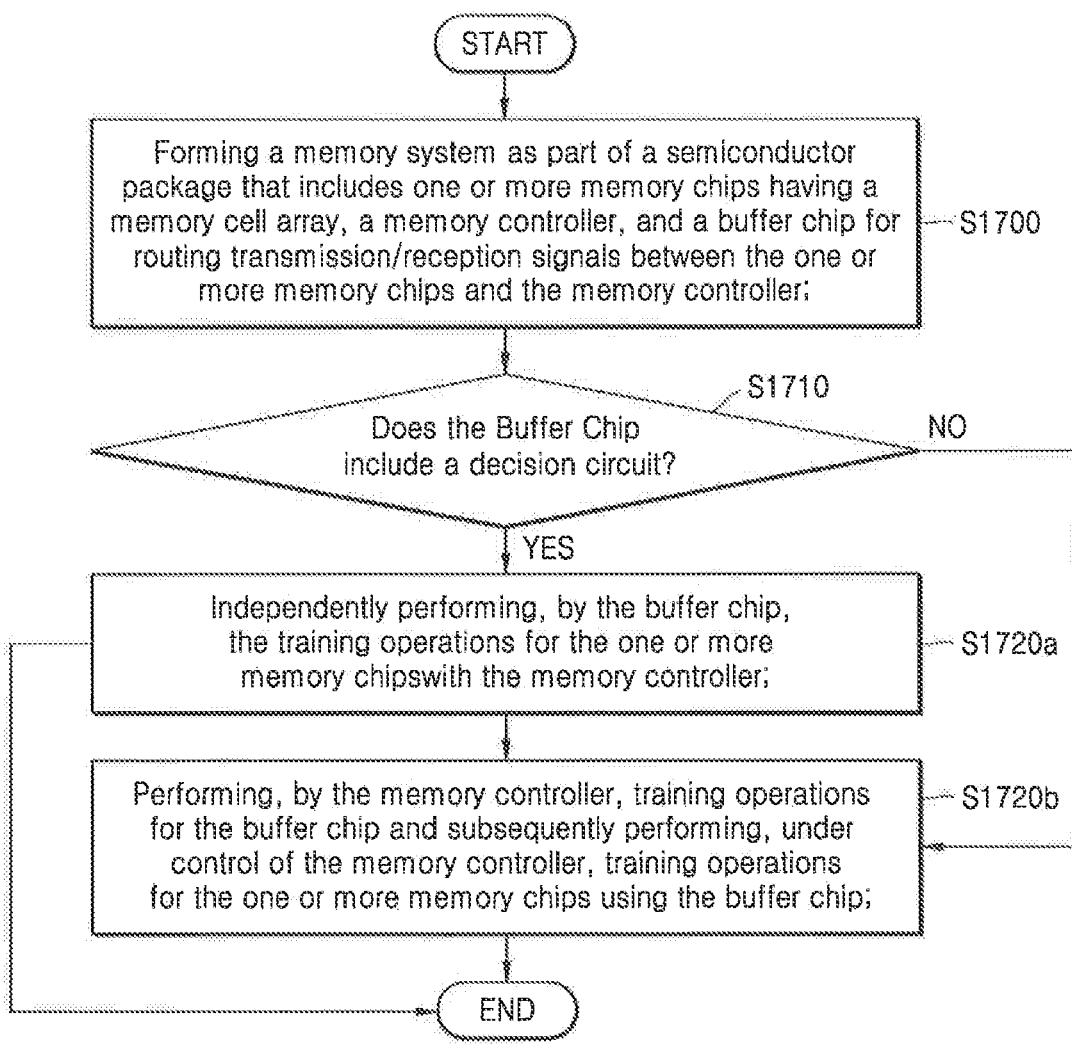
FIG. 17 is a flowchart illustrating a method of manufacturing a semiconducting package having a buffer chip configured according to an embodiment of the inventive concept.

FIG. 17 is a flowchart illustrating a method of manufacturing a semiconducting package having a buffer chip configured according to an embodiment of the inventive concept.

The operations in FIG. 17 may be applied, for example, to various configurations of the inventive concept, such as shown in FIGS. 14-16. However, a person of ordinary skill in the art should understand and appreciate the inventive concept is not limited to the examples shown and described.

Referring to operation (S1700) and FIG. 14, a memory system is formed that is part of a semiconductor package including one or more memory chips 1800 arranged. For example, in a memory module 1400, each of the memory chips may have a memory cell array, a buffer chip 1600 that may have a training block TB, and a memory controller 1200 that controls memory operations of the memory module via the buffer chip 1600. The buffer chip 1600 routes transmission and reception signals from one or more memory chips and the memory controller.

At (S1710) the training operations are dependent upon whether the buffer chip 1600 has a decision circuit, such as previously-shown and described herein.

If the buffer chip 1600 has a decision circuit, then at S1720a, the buffer chip may independently perform training operations for the memory devices controlled by the memory controller. The training operations may be one of the types previously-disclosed.

The inventive concept is an improvement over known memory structures at least because, for example, training operations between the buffer chip and the memory device may be simultaneously performed so that a time to perform the training operations may be reduced.

If the buffer chip does not include a decision circuit, then at S1720b, rather than independent performance such as in operation S1720a, the memory controller 1200 may first perform training operations for buffer chip 1600. Subsequently, under the control of the memory controller 1200, training operations for the one or more memory devices may be performed by the buffer chip 1600.

Although the above example of FIG. 17 had various training operations performed based on whether or not a decision circuit was including in the buffer chip, the inventive concept is not limited thereto. Thus, according to the elements of the buffer chip, the training operations for the memory devices may be performed in various ways, such as described hereinabove.

While the inventive concept has been particularly shown and described with reference to embodiments thereof, it will be understood that various changes in form and details may be made therein without departing from the spirit and scope of the following claims.

What is claimed is:

1. A memory system comprising:
a memory module comprising a plurality of memory devices;
a memory controller configured to control a memory operation of the plurality of memory devices; and
a buffer device connected between the plurality of memory devices and the memory controller, the buffer device comprising a training block including a first signal delay circuit to perform training operations for the plurality of memory devices;
wherein the memory controller is configured to control the training block to perform the training operations for the plurality of memory devices and comprises a second signal delay circuit to perform training operations for the buffer device.

2. The memory system of claim 1, wherein the memory controller is configured to compare a pattern data corresponding to training data with a sampling data generated by sampling the training data from a memory device selected as an object for the training operations for the plurality of memory devices from among the plurality of memory devices, generates a delay control signal used to control a degree of delay of the first signal delay circuit based on a result of the comparison of the pattern data with the sampling data, and transmits the delay control signal to the buffer device.

3. The memory system of claim 2, wherein the sampling data is received from the buffer device, and the training block samples the training data using a data strobe signal for the training operations for the plurality of memory devices to generate the sampling data.

4. The memory system of claim 2, wherein, based on the delay control signal, the first signal delay circuit delays signals used to perform the training operations for the plurality of memory devices on the selected memory device.

5. The memory system of claim 1, wherein, when performing the training operations for the buffer device and performing the memory operation for the plurality of memory devices, the memory controller generates, based on a result of performing the training operations for the buffer device, a second timing compensation information for reference by the memory controller during a timing compensation operation for signals transmitted/received by the buffer device.

6. The memory system of claim 5, wherein, based on the second timing compensation information, the memory controller compensates for a timing of signals to be transmitted to the buffer device and signals received from the buffer device.

7. The memory system of claim 5, wherein, the memory controller is configured to initially perform the training operations for the buffer device, and the memory controller is further configured to subsequently perform the training operations for the plurality of memory devices by controlling operation of the training block.

8. A memory system comprising:
a memory module comprising a plurality of memory devices;
a memory controller configured to control a memory operation of the plurality of memory devices; and
a buffer device connected between the plurality of memory devices and the memory controller, the buffer device comprises a training block configured to perform training operations for the plurality of memory devices;
wherein the memory controller is configured to control the training block to perform the training operations, and
wherein, when performing a memory operation for the plurality of memory devices, the memory controller generates, based on a result of performing the training operations, a first timing compensation information for reference by the buffer device during a timing compensation operation for signals transmitted/received by the memory devices, the first timing compensation information being transmitted to the buffer device.

9. The memory system of claim 8, wherein the signals transmitted/received by the plurality of memory devices include a first data strobe signal transmitted by the buffer device to the plurality of memory devices and a second data strobe signal received by the buffer device from the plurality of memory devices.

10. The memory system of claim 8, wherein the first timing compensation information includes timing compensation information corresponding to each of the plurality of memory devices.

11. The memory system of claim 8, wherein the buffer device is connected to the plurality of memory devices via at least two channels, and the first timing compensation information includes timing compensation information corresponding to each of the channels.

12. The memory system of claim 8, wherein the buffer device compensates for a timing of signals received from the memory controller and signals received from the plurality of memory devices, based on the first timing compensation information, and transmits the signals received from the memory controller to the plurality of memory devices and the signals received from the plurality of memory devices to the memory controller.

13. A memory system comprising:
a memory controller configured to control a memory operation for a plurality of memory devices; and
a memory module including the plurality of memory devices and a buffer device connected between the plurality of memory devices and the memory controller;

wherein the buffer device includes a training block configured to perform training operations for the plurality of memory devices, and wherein the training block performs the training operations using a first training data and a first data strobe signal each received from a target memory device for the training operations from among the plurality of memory devices, and generates a first timing compensation information for reference by the buffer device during a timing compensation operation for signals relating to a memory operation transmitted/received by the plurality of memory devices.

14. The memory system of claim 13, wherein, when performing read training operations for the target memory device, the training block comprises:
   a signal delay circuit configured to delay the first data strobe signal;
   a sampling circuit configured to sample the first training data using the delayed first data strobe signal and to generate a first sampling data;
   a comparison circuit configured to compare a first pattern data corresponding to the first training data with the first sampling data and to generate a first comparison result; and
   a delay adjusting circuit configured to generate, based on the first comparison result, a first delay control signal used to control a degree of delay of the first data strobe signal and to provide the first delay control signal to the signal delay circuit.

15. The memory system of claim 13, wherein, when performing write training operations for the target memory device, the training block comprises:
   a sampling circuit configured to sample the first training data corresponding to a second pattern data using the first data strobe signal and to generate a second sampling data;
   a comparison circuit configured to compare the second sampling data with the second pattern data and to generate a second comparison result;
   a delay adjusting circuit configured to generate, based on the second comparison result, a second delay control signal used to control a degree of delay of the first data strobe signal; and
   a signal delay circuit configured to delay the first data strobe signal based on the second delay control signal and to transmit the delayed first data strobe signal to the target memory device of the plurality of memory devices.

16. The memory system of claim 13, wherein the memory controller is configured to perform training operations for the buffer device and generates, based on a result of performing the training operations for the buffer device, a second timing compensation information for reference during the timing compensation operation for signals relating to a memory operation transmitted/received by the buffer device.

17. The memory system of claim 13, wherein the training block includes a retiming control unit configured to receive a second pattern data and a second data strobe signal from the memory controller, to re-align the second pattern data based on the second data strobe signal, and to provide the re-aligned second pattern data and the second data strobe signal to the target memory device to perform the training operations for the target memory device.

18. The memory system of claim 13, wherein, when receiving a fourth data strobe signal from a selected memory device during performing of a memory operation of a memory device selected from among the plurality of memory devices, the buffer device, based on the first timing compensation information, compensates for timing for the fourth data strobe signal.

19. A memory module comprising:
   a plurality of memory devices; and
   a plurality of buffer devices configured to route signals to and from the plurality of memory devices,
   wherein the plurality of buffer devices comprises:
   a first sub-buffer device connected to first memory devices from among the plurality of memory devices;
   a second sub-buffer device connected to second memory devices from among the plurality of memory devices; and
   a main buffer device connected to the first sub-buffer device and the second sub-buffer device, and
   wherein the main buffer device is configured to perform first training operations for the first sub-buffer device and second sub-buffer device, and the first sub-buffer device is configured to perform second training operations for the first memory devices, and the second sub-buffer device is configured to perform third training operations for the second memory devices, and
   wherein the first training operations, second training operations and third training operations comprise generating timing compensation information for one or more of a read training operation, and a write training operation.

20. The memory module of claim 19, wherein the main buffer device comprises a first register configured to store timing compensation information corresponding to each of the first sub-buffer device and the second sub-buffer device generated as a result of performing the first training operations, and
   the first sub-buffer device comprises a second register configured to store timing compensation information corresponding to each of the first memory devices generated as a result of performing the second training operations, and
   the second sub-buffer device comprises a third register configured to store timing compensation information corresponding to each of the second memory devices generated as a result of performing the third training operations.

* * * * *